US012796072B2

(12) United States Patent
Fukuda et al.

(10) Patent No.: US 12,796,072 B2
(45) Date of Patent: Nov. 10, 2026

(54) SEMICONDUCTOR DEVICE

(71) Applicant: ROHM CO., LTD., Kyoto (JP)

(72) Inventors: Yoshinori Fukuda, Kyoto (JP); Hajime Okuda, Kyoto (JP); Keiji Yamamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 354 days.

(21) Appl. No.: 18/544,458

(22) Filed: Dec. 19, 2023

(65) Prior Publication Data

US 2024/0213245 A1 Jun. 27, 2024

(30) Foreign Application Priority Data

Dec. 21, 2022 (JP) ................................ 2022-204050

(51) Int. Cl.
*H10D 84/85* (2025.01)
*H10D 30/66* (2025.01)

(52) U.S. Cl.
CPC .......... *H10D 84/85* (2025.01); *H10D 30/668* (2025.01)

(58) Field of Classification Search
CPC .... H10D 30/60; H10D 30/603; H10D 30/605; H10D 30/668; H10D 62/127; H10D 62/157; H10D 62/307; H10D 62/378; H10D 64/117; H10D 64/516; H10D 64/518; H10D 84/01; H10D 84/013; H10D 84/0165; H10D 84/017; H10D 84/0172; H10D 84/0188; H10D 84/038; H10D 84/83; H10D 84/8311; H10D 84/8312; H10D 84/83125; H10D 84/83135; H10D 84/83138; H10D 84/8314; H10D 84/8316; H10D 84/832–833; H10D 84/835; H10D 84/836; H10D 84/837–839; H10D 84/85; H10D 84/851–852; H10D 84/856; H10W 10/0125; H10W 10/014; H10W 10/13; H10W 10/17
See application file for complete search history.

(56) References Cited

U.S. PATENT DOCUMENTS 7,968,418 B1 * 6/2011 Labonte .......... H10W 10/0145 438/424
2017/0053931 A1 2/2017 Yamamoto et al.

FOREIGN PATENT DOCUMENTS

| | | |
|---|---|---|
| JP | 2009-147297 A | 7/2009 |
| JP | 2022-097649 A | 6/2022 |
| WO | 2022/065202 A1 | 3/2022 |

OTHER PUBLICATIONS

Japanese Office Action for JP Application 2022-204050 Issued By Japanese Patent Office On Aug. 6, 2026 with search report, 31 pages including English Translation.

* cited by examiner

*Primary Examiner* — Cheung Lee
(74) *Attorney, Agent, or Firm* — XSENSUS LLP

(57) ABSTRACT

The present disclosure provides a semiconductor device. The semiconductor device includes a semiconductor chip having an element main surface; a first element disposed on the element main surface; a second element disposed on the element main surface and separated from the first element; and a third element disposed on the element main surface and separated from the first element and the second element. The first element includes a DTI structure as a part of an element structure. The second element includes an STI structure. The third element includes a LOCOS structure.

20 Claims, 19 Drawing Sheets

SEMICONDUCTOR DEVICE

CROSS-REFERENCE TO RELATED APPLICATION

This application is based upon and claims the benefit of priority from Japanese Patent Application No 2022-204050, filed on Dec. 21, 2022, the entire contents of which are incorporated herein by reference.

TECHNICAL FIELD

The present disclosure relates to a semiconductor device.

BACKGROUND

For example, patent publication 1 discloses a semiconductor device including a semiconductor layer and multiple insulated gate transistors. The multiple insulated gate transistors are electrically independent from the semiconductor layer by a manner that multiple electrically independent control signals are input individually, and are individually controlled to be on and off by a manner that an on-resistance during an active clamping operation is different from an on-resistance during a normal operation.

PRIOR ART DOCUMENT

Patent Publication

[Patent document 1] Japan Patent Publication No. 2022-97649

DETAILED DESCRIPTION OF THE EMBODIMENTS

Embodiments are described in detail with reference to the accompanying drawings below. These accompanying drawings are schematic and are not strictly depicted according to consistent down-scales. The corresponding structures among these accompanying drawings are denoted by the same reference symbols or numerals, and the repeated details are omitted or simplified. The structures with omitted or simplified details are used to omit or simplify the details previously described.

In an expression such as "substantially equal to" in the description concerning a comparison subject, the expression includes a numerical value (form) equivalent to the numerical value (form) of the comparison target, and further includes a numerical error (form error) within a range of ±10% of the numerical value (form) of the comparison target used a reference. Terms such as "first", "second" and "third" are used in the embodiments, and these terms are merely denotations given to the names of the structures to clearly describe orders and are not intended to form limitations to the names of the structures.

Figure 1:
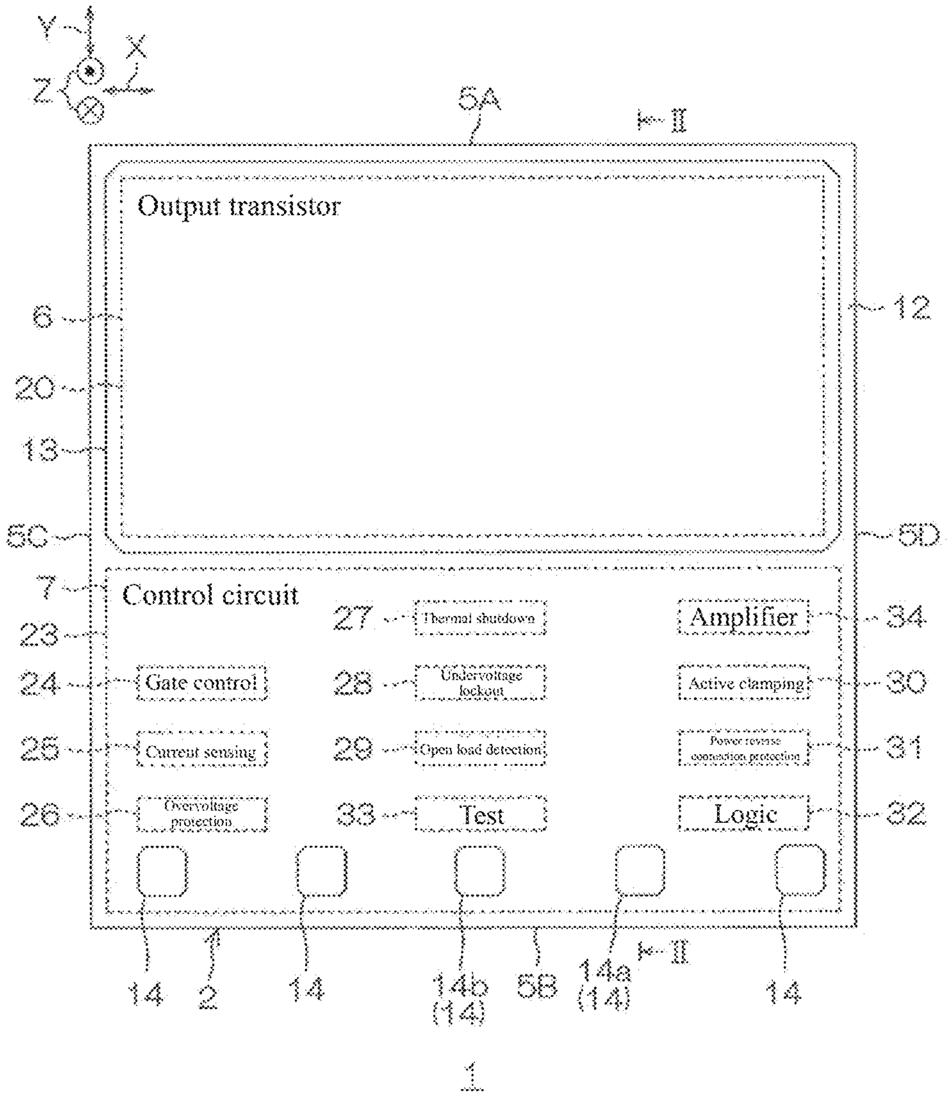
FIG. 1 is a schematic plan view of a semiconductor device according to an embodiment of the present disclosure.
Figure 2:
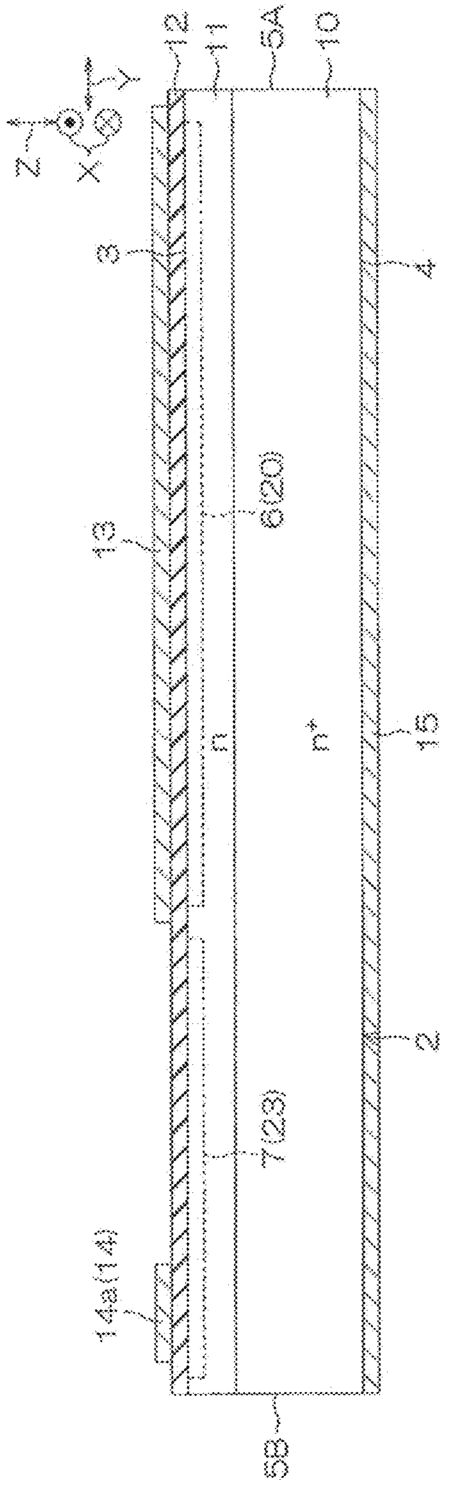
FIG. 2 is a cross-sectional view along a section line II-II in FIG. 1.

FIG. 1 shows a schematic plan view of a semiconductor device 1 according to an embodiment of the present disclosure. FIG. 2 shows a cross-sectional view along a section line II-II in FIG. 1. Referring to FIG. 1 and FIG. 2, the semiconductor device 1 includes a chip 2 formed in a rectangular shape. In this embodiment, the chip 2 is a silicon (Si) chip containing Si single crystals.

The chip 2 can also be formed by a wide bandgap semiconductor chip including wide bandgap semiconductor single crystals. The wide bandgap semiconductor is a semiconductor having a bandgap greater than that of Si. The wide bandgap semiconductor is, for example, gallium nitride (GaN), silicon carbide (SiC) or diamond (C). For example, the chip 2 can also be a SiC chip including SiC single crystals.

The chip 2 includes a first main surface 3 on one side, a second main surface 4 on the other side, and four side surfaces 5A to 5D connecting the first main surface 3 and the second main surface 4. The first main surface 3 and the second main surface 4 are formed to have quadrilateral shapes (specifically, rectangles) in a plan view when observed in a normal direction Z thereof (to be referred to as "in the plan view" below). The normal direction Z is also a thickness direction of the chip 2.

The first main surface 3 is a circuit surface where various circuit structures forming electronic circuits are formed. The second main surface 4 is a non-circuit surface without any circuit structures. The first side surface 5A and the second side surface 5B extend in a first direction X of the first main surface 3, and are opposite (back facing) in a second direction Y intersecting (specifically, perpendicular to) the first direction X. The third side surface 5C and the fourth side surface 5D extend in the second direction Y, and are opposite (back facing) in the first direction X.

The semiconductor device 1 includes an output region 6 disposed on the first main surface 3. The output region 6 is a region having electronic circuits (circuit components)

configured to generate output signals output to an outside. In this embodiment, the output region 6 is defined as a region formed on a side of the first side surface 5A on the first main surface 3. The output region 6 is defined and formed to have a polygonal shape (a quadrilateral shape in this embodiment) with four sides parallel to a periphery of the first main surface 3) in the plan view.

The position, size and planar shape of the output region 6 can be any as desired and are not limited to a specific layout. The output region 6 can have a planar area between 25% and 80% of a planar area of the first main surface 3. The output region 6 can have a planar area of 30% or more of the planar area of the first main surface 3. The output region 6 can also have a planar area of 40% or more of the planar area of the first main surface 3. The output region 6 can further have a planar area of 50% or more of the planar area of the first main surface 3. The output region 6 can also have a planar area of 75% or less of the planar area of the first main surface 3.

The semiconductor device 1 includes a control region 7 disposed in a region different from the output region 6 on the first main surface 3. The control region 7 is a region having multiple electronic circuits (circuit components) configured to generate control signals for controlling the output region 6. In this embodiment, the control region 7 is defined and formed in a region on the side of the second side surface 5B relative to the output region 6, and faces the output region 6 in the second direction Y. In this embodiment, the output region 7 is defined to have a polygonal shape (a quadrilateral shape in this embodiment) with four sides parallel to the periphery of the first main surface 3 in the plan view.

The position, size and planar shape of the control region 7 can be any as desired and are not limited to a specific layout. The control region 7 can have a planar area between 25% and 80% of a planar area of the first main surface 3. The control region 7 can have a planar area of 30% or more of the planar area of the first main surface 3. The control region 7 can also have a planar area of 40% or more of the planar area of the first main surface 3. The control region 7 can further have a planar area of 50% or more of the planar area of the first main surface 3. The control region 7 can also have a planar area of 75% or less of the planar area of the first main surface 3.

The planar area of the control region 7 can be substantially equal to the planar area of the output region 6. The planar area of the control region 7 can also be greater than the planar area of the output region 6. The planar area of the control region 7 can also be less than the planar area of the output region 6. A ratio of the planar area of the control region 7 to the planar area of the output region 6 can be between 0.1 and 4.

The semiconductor device 1 includes an n-type (first conductivity type) drain region 10 formed on a surface layer of the second main surface 4. An n-type impurity concentration of the drain region 10 can be between $1\times10^{18}$ $cm^{-3}$ and $1\times10^{21}$ $cm^{-3}$. The drain region 10 is formed as a layer extending globally on the surface layer of the second main surface 4 and along the second main surface 4, and is exposed from the second main surface 4 and the first to fourth side surfaces 5A to 5D. The drain region 10 can have a thickness between 50 μm and 200 μm. The thickness of the drain region 10 is preferably 150 μm or less. In this embodiment, the drain region 10 is formed by an n-type semiconductor substrate (Si substrate).

The semiconductor device 1 includes an n-type drift region 11 formed on a surface layer of the first main surface 3. The drift region 11 has an n-type impurity concentration lower than that of the drain region 10. The n-type impurity concentration of the drift region 11 can be between $1\times10^{15}$ $cm^{-3}$ and $1\times10^{18}$ $cm^{-3}$. The drift layer 11 is formed as a layer extending along the first main surface 3 in the output region 6 and the control region 7. More specifically, the drain region 11 is formed as a layer extending globally on the surface layer of the first main surface 3 and along the first main surface 3, and is exposed from the first main surface 3 and the first to fourth side surfaces 5A to 5D.

The drift region 11 is electrically connected to the drain region 10 in the chip 2. The drift region 11 has a thickness less than that of the drain region 10. The thickness of the drift region 11 can be between 1 μm and 20 μm. The thickness of the drift region 11 is preferably between 5 μm and 15 μm. The thickness of the drift region 11 is more preferably 10 μm or less. In this embodiment, the drift region 11 is formed by an n-type epitaxial layer (Si epitaxial layer).

The semiconductor device 1 further includes an interlayer insulating layer 12 covering the first main surface 3. The interlayer insulating layer 12 universally covers the output region 6 and the control region 7. The interlayer insulating layer 12 can globally cover the first main surface 3 by a manner of being connected to the periphery (the first to fourth side surfaces 5A to 5D) of the first main surface 3. As a matter of course, the interlayer insulating layer 12 can also be formed inward at an interval from the periphery of the first main surface 3 to expose a peripheral portion of the first main surface 3.

In this embodiment, the interlayer insulating layer 12 is configured as a multi-layer wiring structure having a laminated structure, wherein the laminated structure is formed by alternately laminating multiple insulating layers and multiple wiring layers. Each of the insulating layers can include at least one of a silicon oxide film and a silicon nitride film. Each of the wiring layers can also include at least one of a pure aluminum (Al) layer (an Al layer having a purity of 99% or more), a copper (Cu) layer (a Cu layer having a purity of 99% or more), an AlCu alloy layer, an AlSiCu alloy layer and an AlSi alloy layer.

The semiconductor device 1 includes multiple terminals 13 to 15 disposed on either or both (both in this embodiment) of the first main surface 3 and the second main surface 4. The multiple terminals 13 to 15 include a source terminal 13, multiple control terminals 14 and a drain terminal 15.

In this embodiment, the source terminal 13 is provided to serve as an output terminal electrically connected to a load, and is disposed on the part covering the output region 6 in the interlayer insulating layer 12. The source terminal 13 can globally cover the output region 6 in the plan view. The source terminal 13 can include at least one of a pure Al layer, a Cu layer, an AlCu alloy layer, a AlSiCu alloy layer and an AlSi alloy layer.

The multiple control terminals 14 are terminals electrically connected to various electronic circuits in the control region 7, and are disposed on the part covering the control region 7 in the interlayer insulating layer 12. The multiple control terminals 14 individually have planar areas less than a planar area of the source terminal 13, and are disposed at intervals along a peripheral portion (the peripheral portion of the first main surface 3) of the control region 7.

The planar areas of the individual control terminals 14 can be set to be within a range connectable to bonding wires. The planar area of each of the control region 14 can be 1/10 or less of the planar area of the source terminal 13. The multiple control terminal 14 can include at least one of a pure Al layer, a Cu layer, an AlCu alloy layer, a AlSiCu alloy layer and an AlSi alloy layer.

The multiple control terminals 15 include at least one ground terminal 14*a* fixedly connected to a ground potential, and at least one input terminal 14*b* providing an electrical signal to the control region 7. A configuration position of the ground terminal 14*a* can be any as desired. In the plan view, the ground terminal 14*a* can be disposed on an inner portion of the control region 7, or can be disposed on the part on one side along the first main surface 3, or can be disposed on a corner of the first main surface 3. The ground terminal 13*a* is connected to a bonding wire, and is supplied with a ground potential from the outside via the bonding wire.

A configuration position of the input terminal 14*b* can be any as desired. In the plan view, the input terminal 14*b* can be disposed on an inner portion of the control region 7, or can be disposed on the part on one side along the first main surface 3, or can be disposed on a corner of the first main surface 3.

In this embodiment, an example where the input terminal 14*b* is formed by a test terminal is shown. The test terminal is input with a test signal for testing electrical characteristics of a control circuit 23 during a manufacturing process. The test terminal is provided to serve as an abutting target of a probe of an electrical characteristics test device, and is a terminal configured to be input with a test signal from the probe.

The input terminal 14*b* is a structure that is not a connection target of a bonding wire in the semiconductor device 1 after manufacturing. That is, the input terminal 14*b* is formed as an open terminal (a dummy terminal). The open terminal is a terminal that does not receive any external signal (potential) but is in an electrically floating state.

For example, when the semiconductor device 1 is mounted in a semiconductor package, the input terminal 14*b* is globally covered by an insulator (for example, a sealing resin including multiple fillers and a base resin) and is electrically insulated from other structures. As a matter of course, the input terminal 14*b* can also be electrically connected to a lead wire terminal of the semiconductor package via a bonding wire, and the semiconductor device 1 is configured to be input with a test signal after it is mounted in the semiconductor package.

In this embodiment, the drain terminal 15 is provided as a power supply terminal, and directly covers the second main surface 4 of the chip 2. That is, in this embodiment, the semiconductor device 1 is a high-side switch device electrically interposed between a power supply and a load. The drift terminal 15 is electrically connected to the drain region 10 on the second main surface 4. The drain terminal 15 globally covers the second main surface 4 by a manner of being connected to the periphery (the first to fourth side surfaces 5A to 5D) of the second main surface 4.

Figure 3:
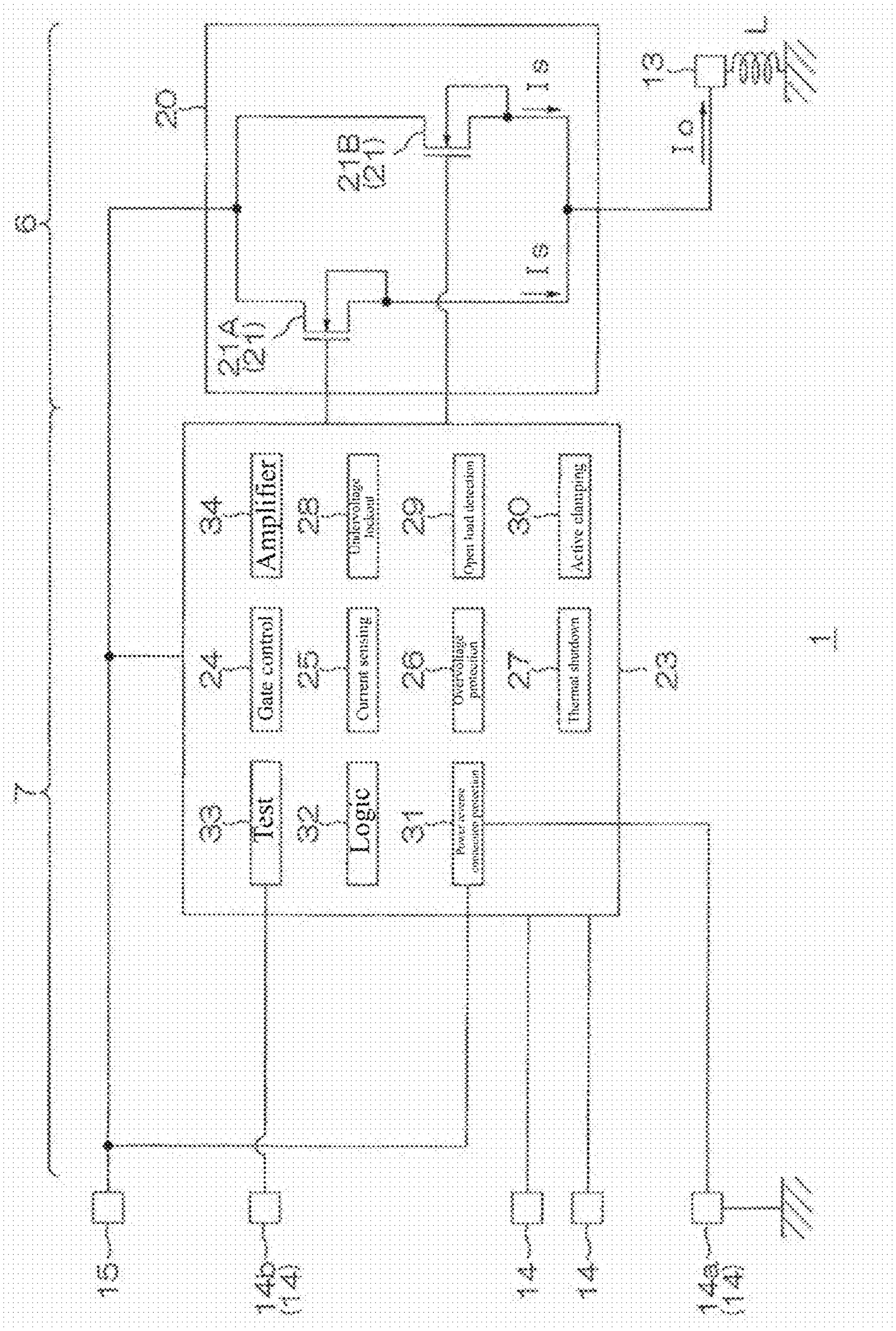
FIG. 3 is a brief circuit diagram of an electrical configuration of the semiconductor device in FIG. 1.
Figure 4:
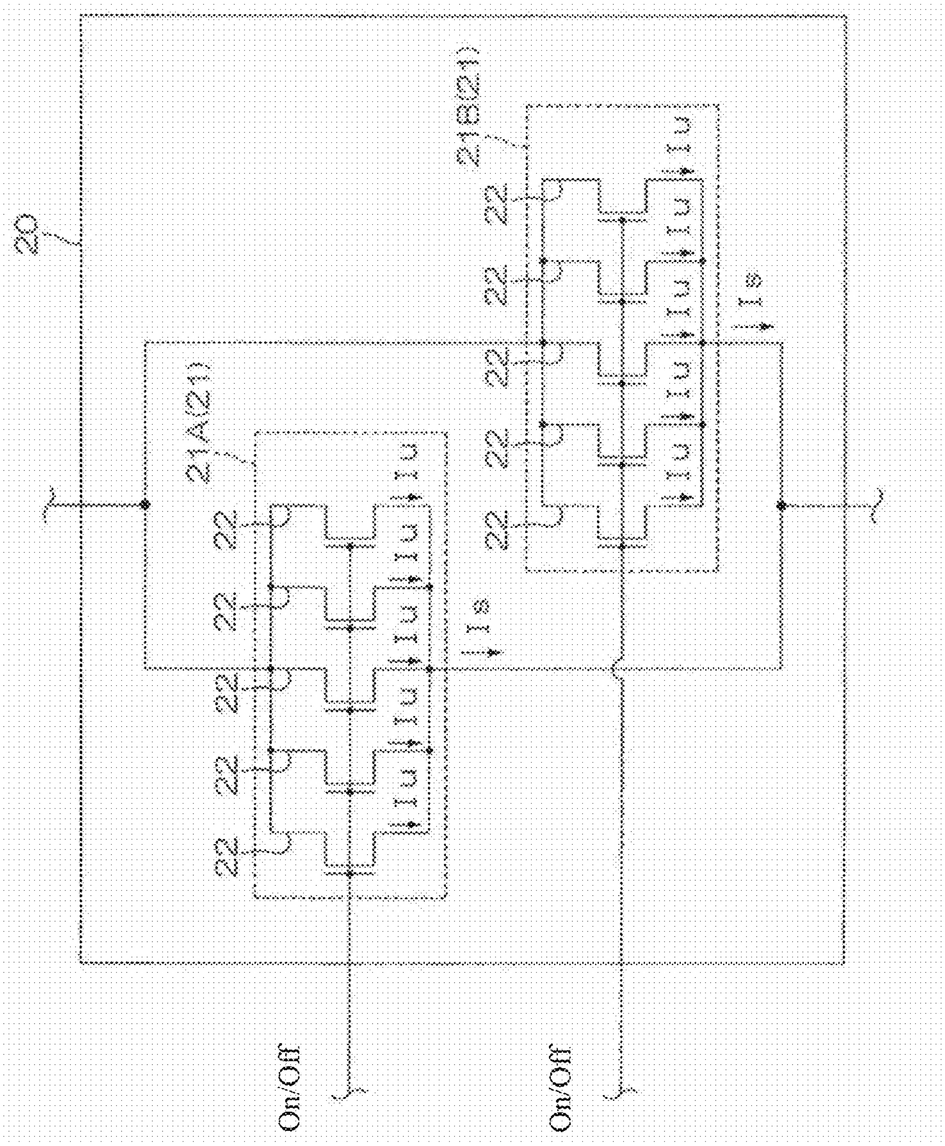
FIG. 4 is a brief circuit diagram of a configuration of an output transistor.

FIG. 3 shows a brief circuit diagram of an electrical configuration of the semiconductor device 1 in FIG. 1. FIG. 4 shows a brief circuit diagram of a configuration of an output transistor 20.

In FIG. 3, in order to exhibit an operation example of the semiconductor device 1, an example with an inductive load L as a load connected to the source terminal 13 is shown. The inductive load L is not a constituting element of the semiconductor device 1. Thus, a configuration including the semiconductor device 1 and the inductive load L can also be referred to as "an inductive load drive device" or "an inductive load control device". For example, the inductive load L is a relay, a solenoid, a lamp or a motor. The inductive load L can also be a vehicle inductive load. That is, the semiconductor device 1 can also be a vehicle semiconductor device.

Referring to FIG. 3 and FIG. 4, the semiconductor device 1 includes the output transistor 20 formed in the output region 6. In this embodiment, the output transistor 20 is formed by a transistor which is a gate split type and includes one main drain, one main source and multiple main gates. The main drain is electrically connected to the drain terminal 15. The main source is electrically connected to the source terminal 13.

The multiple main gates are configured to be individually input with multiple electrically independent gate signals (gate potentials). The output transistor 20 generates one single output current Io (an output signal) in response to the multiple gate signals. That is, the output transistor 20 is formed by a multiple-input-single-output switch device. The output current Io is a drain/source current flowing between the main drain and the main source. The output current Io is output to the outside of the chip 2 (the inductive load L) via the source terminal 13.

The output transistor 20 includes multiple (two or more) system transistors 21 that are electrically controlled separately. In this embodiment, the multiple system transistors 21 include a first system transistor 21A and a second system transistor 21B. The multiple system transistors 21 are collectively formed in the output region 6. The multiple system transistors 21 are configured to be connected in parallel so as to be individually input with the multiple gate signals, and by a manner that a system transistor 21 in an on state and a system transistor 21 in an off can coexist.

Each of the multiple system transistors 21 includes a system drain, a system source and a system gate. The multiple system drains are electrically connected to the main drain (the drain terminal 15). The multiple system sources are electrically connected to the main source (the drain terminal 13). The system gates are electrically connected to the main gates, respectively. In other words, the system gates form the main gates, respectively.

Each of the multiple system transistors 21 generates a system current Is in response to a corresponding gate signal. Each system current Is is a drain/source current flowing between the system drain and the system source of each system transistor 21. The multiple system currents Is can have different values, or can have substantially equal values. The multiple system currents Is are summed between the main drain and the main source. Accordingly, the one single output current Io is formed by a sum of the multiple system currents Is.

Referring to FIG. 4, each of the multiple system transistor 21 includes one or multiple unit transistors 22 that are systemized (grouped) as individual control objects. More specifically, the multiple system transistors 21 are formed by one single unit transistor 22 or a parallel circuit including multiple unit transistors 22. In this embodiment, each of the multiple unit transistors 22 is formed by a trench gate vertical transistor. The multiple system transistors 21 can be formed by the same number of unit transistors 22, or can be formed by different numbers of unit transistors 22.

Each unit transistor 22 includes a unit drain, a unit source and a unit gate. The unit drain of each unit transistor 22 is electrically connected to the system drain of the corresponding system transistor 21. The unit source of each unit transistor 22 is electrically connected to the system source of the corresponding system transistor 21. The unit gate of each unit transistor 22 is electrically connected to the system gate of the corresponding system transistor 21.

Each of the multiple unit transistors 22 generates a unit current Iu in response to a corresponding gate signal. Each unit current Iu is a drain/source current flowing between the unit drain and the unit source of each unit transistor 22. The multiple unit currents Iu can have different values, or can have substantially equal values. The multiple unit currents Iu are summed between the system drain and the system source. Accordingly, the system current Is is formed by a sum of the multiple unit currents Iu.

As described above, the output transistor 20 is configured such that the first system transistor 21A and the second system transistor 21B are controlled to be on and off in a mutually electrically separate state. That is, the output transistor 20 is configured such that both of the first system transistor 21A and the second system transistor 21B are simultaneously turned on. Moreover, the output transistor 20 is also configured such that either of the first system transistor 21A and the second system transistor 21B is turned on while the other is turned off.

When both of the first system transistor 21A and the second system transistor 21B are turned on, the channel utilization efficiency of the output transistor 20 is improved and an on-resistance is reduced. Moreover, when either of the first system transistor 21A and the second system transistor 21B is turned on while the other is turned off, the channel utilization efficiency of the output transistor 20 is reduced and the on-resistance is increased. That is, the output transistor 20 is configured to be a switch device with a variable on-resistance.

The semiconductor device 1 includes a control circuit 23 electrically connected to the output transistor 20 and formed in the control region 7. The control circuit 23 can also be referred to as "a control integrated circuit (IC)". The control circuit 23 includes various function circuits, and together with the output transistor 20 form an intelligent power device (IPD). The IPD can also be referred to as an intelligent power module (IPM), an intelligent power switch (IPS), an intelligent power driver, an intelligent metal insulator semiconductor field effect transistor (MISFET), or a protection MISFET.

In this embodiment, the control circuit 23 includes a gate control circuit 24, a current monitoring circuit 25, an overcurrent protection circuit 26, an overheat protection circuit 27, a low-voltage malfunction prevention circuit 28, a load open detection circuit 29, an active clamping circuit 30, a power reverse connection protection circuit 31, a logic circuit 32, a test circuit 33, and an amplifier circuit 34. The control circuit 23 does not necessarily include all of these function circuits at the same time, but can include at least one of these function circuits.

The monitoring circuit 25 can also be referred to as a current sense circuit. The overcurrent protection circuit 26 can also be referred to as an OCP circuit. The overheat protection circuit 27 can also be referred to as a thermal shut down (TSD) circuit. The low-voltage malfunction prevention circuit 28 can also be referred to as an undervoltage lockout (UVLO) circuit. The load open detection circuit 29 can also be referred to as an OLD circuit. The power reverse connection protection circuit 31 can also be referred to as a reverse battery protection (RBP) circuit. The amplifier circuit 34 can also be referred to as an AMP circuit.

The gate control circuit 24 is configured to generate a gate signal for controlling on and off of the output transistor 20. More specifically, the gate control circuit 24 generates multiple gate signals for individually controlling on and off of the multiple system transistors 21. That is, in this embodiment, the gate control circuit 24 generates a first gate signal for individually controlling on and off of the first system transistor 21A, and a second gate signal for the second system transistor 21B to be electrically separate from the first system transistor 21A and for individually controlling on and off of the second system transistor 21B.

The current monitoring circuit 25 generates a monitoring current for monitoring the output current Io of the output transistor 20, and outputs the monitoring current to other circuits. For example, the monitoring circuit can also include a transistor having a same configuration as the output transistor 20, wherein the transistor is configured to be controlled to be on and off simultaneously with the output transistor 20 so as to generate a monitoring current linked with the output current Io. The current monitoring circuit 25 can also be configured to generate a monitoring current linked with one or more system currents Is.

The overcurrent protection circuit 26 generates an electrical signal for controlling the gate control circuit 24 based on the monitoring current from the current monitoring circuit 25, and controls on and off of the output transistor 20 in cooperation with the gate control circuit 24. For example, the overcurrent protection circuit 26 can be configured to, when the monitoring current reaches above a predetermined threshold, determine that the output transistor 20 is in an overcurrent state, and controls in cooperation with the gate control circuit 24, a part or all of the output transistor 20 (the multiple system transistors 21) to be off. Moreover, the overcurrent protection circuit 26 can be configured to, when the monitoring current is less than the predetermined threshold, convert in cooperation with the gate control circuit 24, the output transistor 20 to a normal operation.

The overheat protection circuit 27 includes a first temperature sensing device (for example, a temperature sensing diode) detecting a temperature of the output region 6, and a second temperature sensing device (for example, a temperature sensing diode) detecting a temperature of the control region 7. The overheat protection circuit 27 generates an electrical signal for controlling the gate control circuit 24 based on a first temperature detection signal from the first temperature sensing device and a second temperature detection signal from the second temperature sensing device, and controls on and off of the output transistor 20 in cooperation with the gate control circuit 24.

For example, the overheat protection circuit 27 can be configured to, when a difference between the first temperature detection signal and the second temperature detection signal reaches above a predetermined threshold, determine that the output region 6 is in an overheat state, and controls in cooperation with the gate control circuit 24, a part or all of the output transistor 20 (the multiple system transistors 21) to be off. Moreover, the overheat protection circuit 27 can be configured to, when the difference is less than the predetermined threshold, convert in cooperation with the gate control circuit 24, the output transistor 20 to a normal operation.

The low voltage malfunction prevention circuit 27 is configured to prevent various function circuits in the control circuit 23 from malfunctioning when a starting voltage used to start the control circuit 23 is less than a predetermined value. For example, the low voltage malfunction prevention circuit 28 can be configured to start the control circuit 23 when a start voltage reaches above a predetermined threshold voltage, or to stop the control circuit 23 when the start voltages is less than the threshold voltage. The threshold voltage can include hysteresis characteristics.

The load open detection circuit 29 is for determining an electrical connection state of the inductive load L. For example, the load open detection circuit 29 can be configured to monitor an inter-terminal voltage of the output transistor 20, and determine that the inductive load L is open-circuit when the inter-terminal voltage reaches above a predetermined threshold. For example, the load open detection circuit 29 can be configured to determine that the inductive load L is open-circuit when the monitoring circuit is below the predetermined threshold.

The active clamping circuit 30 is electrically connected to the main drain and at least one main gate (for example, the system gate of the first system transistor 21A) of the output transistor 20. The active clamp circuit 30 includes a Zener diode, and a pn-junction diode connected in series to the Zener diode with a reverse bias. The pn-junction diode is an anti-reverse current diode that prevents a reverse current from the output transistor 20.

The active clamping circuit 30 is configured to control in cooperation with the gate control circuit 24, a part or all of the output transistor 20 to be on, when a reverse voltage caused by the inductive load L is applied to the output transistor 20. More specifically, the output transistor 20 is controlled by multiple operation modes including a normal operation, a first off operation, an active clamping operation and a second off operation.

In the normal operation, both of the first system transistor 21A and the second system transistor 21B are controlled to be on. Accordingly, the channel utilization efficiency of the output transistor 20 is improved and the on-resistance is reduced. In the first off operation, both of the first system transistor 21A and the second system transistor 21B are controlled to be from on to off. Accordingly, the reverse voltage caused by the inductive load L is applied to both of the first system transistor 21A and the second system transistor 21B.

An active clamping operation is an operation for energy stored in the inductive load L to be absorbed (consumed) by the output transistor 20, and is performed when the reverse voltage caused by the inductive load L reaches above the predetermined threshold voltage. In the active clamping operation, the first system transistor 21A is controlled to be from off to on, while the second system transistor 21B is controlled to be (kept) off.

The channel utilization efficiency of the output transistor 20 during the active clamping operation is less than the channel utilization efficiency of the output transistor 20 during the normal operation. The on-resistance of the output transistor 20 during the active clamping operation is greater than the on-resistance of the output transistor 20 during the normal operation. Accordingly, a drastic temperature rise in the output transistor 20 during the active clamping operation is inhibited, and active clamp tolerance improved.

The second off operation is performed when the reverse voltage is less than the predetermined threshold voltage. In the second off operation, the first system transistor 21A is controlled to be from on to off, while the second system transistor 21B is controlled to be (kept) off. As such, the reverse voltage (energy) of the inductive load L is absorbed by a part of the output transistor 20 (the first system transistor 21A herein). As a matter of course, during the active clamping operation, the first system transistor 21A can be controlled to be (kept) off, while the second system transistor 21B is controlled to be on.

The power reverse connection circuit 31 is configured to detect a reverse voltage when a power supply is connected in reverse, and to protect the control circuit 23 and the output transistor 20 to be unaffected by the reverse voltage (a reverse current). The logic circuit 23 is configured to generate electrical signals supplied to various circuits in the control circuit 23.

The test circuit 33 is electrically interposed between the input terminal 14*b* and the drain terminal 15 and formed on the first main surface 3, and is electrically connected to the input terminal 14*b* and the drain terminal 15. The test circuit 33 is formed to indirectly evaluate the electrical characteristics of the control circuit 23 during the manufacturing process. The test circuit 33 is preferably disposed in a region adjacent to the input terminal 14*b* in the plan view.

The amplifier circuit 34 is configured to, for example, when the semiconductor device 1 is mounted in a vehicle, amplify detection signals that are input by various vehicle sensors (for example, pressure sensors, inertial sensors, magnetoresistive random (MR) sensors) into the semiconductor device 1.

[Element Having DTI Structure]

Figure 5:
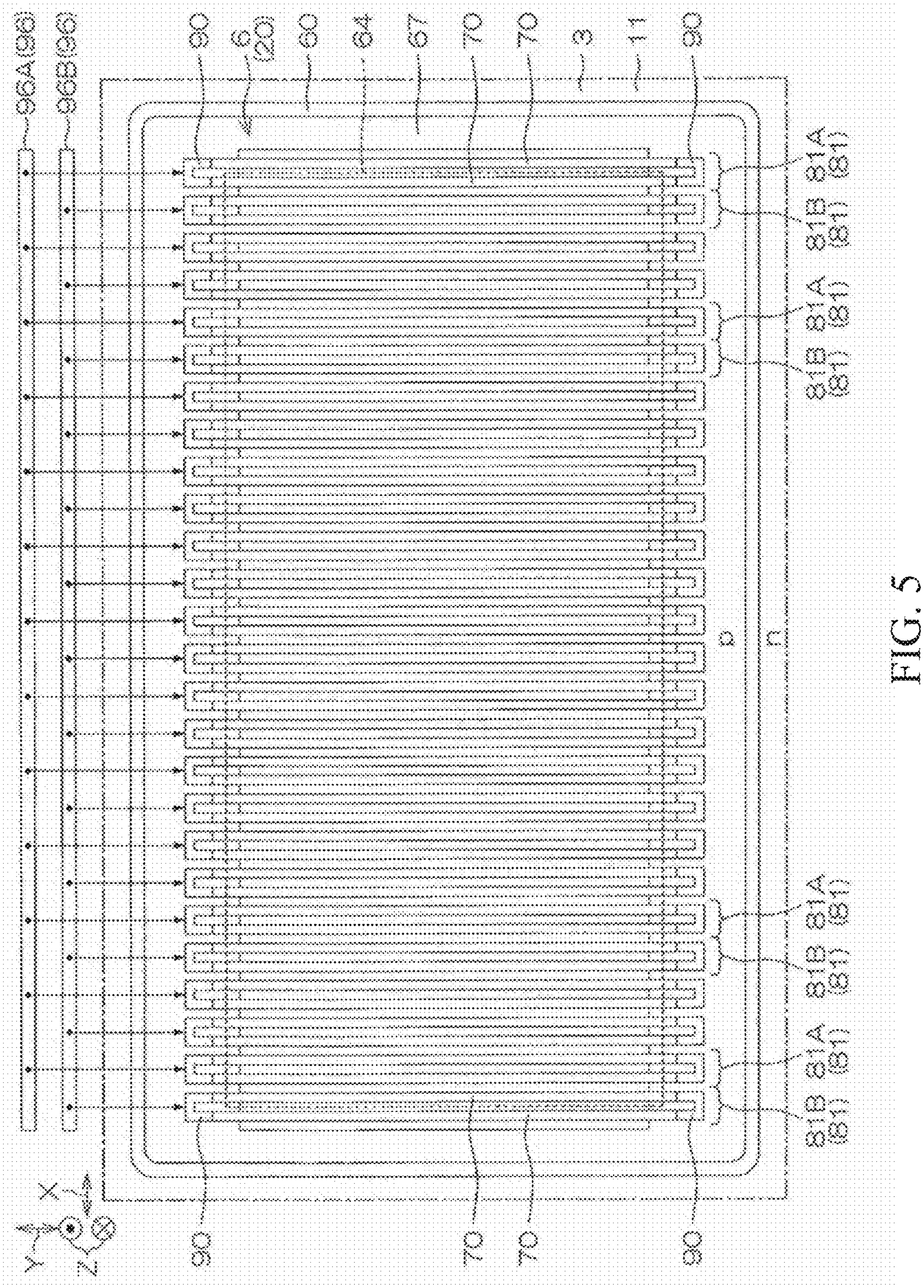
FIG. 5 is a plan view of an output region shown in FIG. 1.
Figure 6:
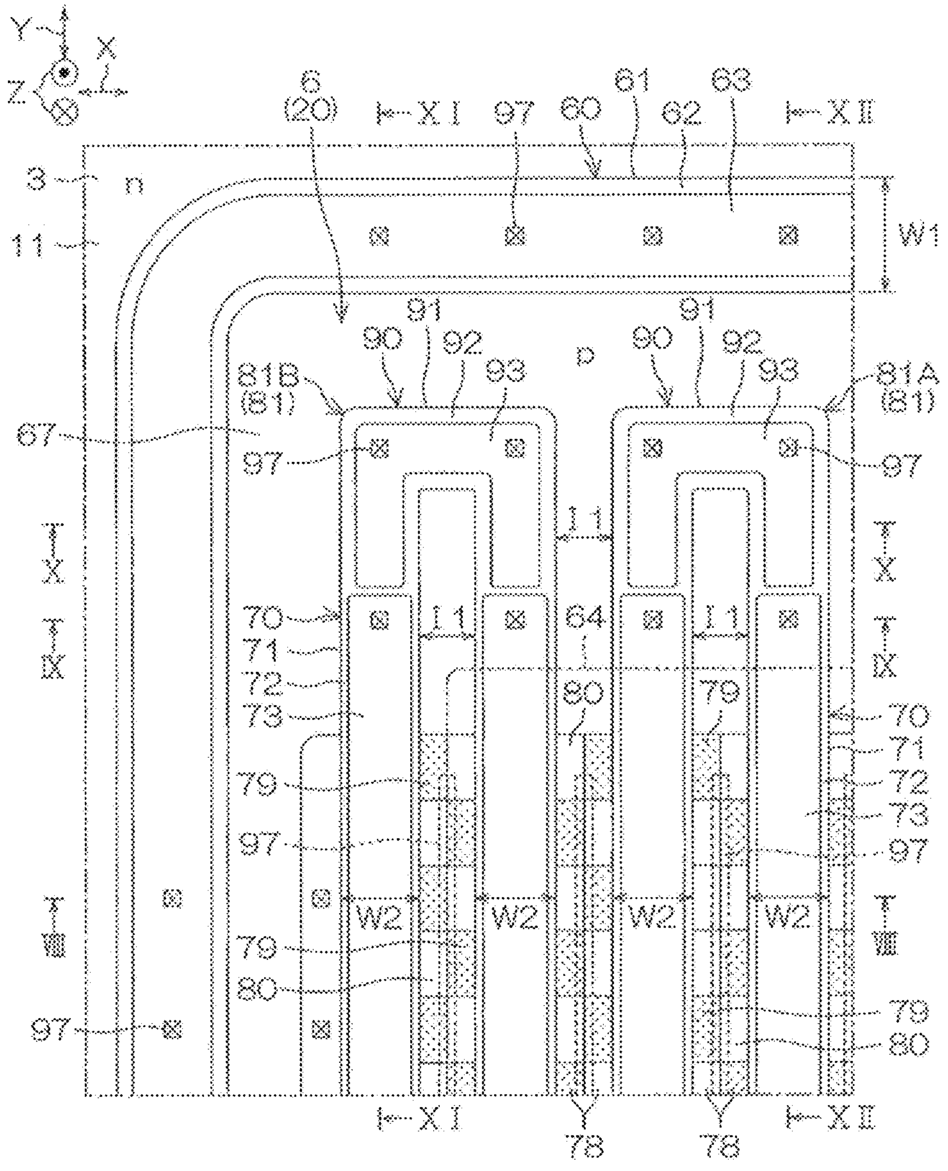
FIG. 6 is an enlarged plan view of a main part of the output region shown in FIG. 5.
Figure 7:
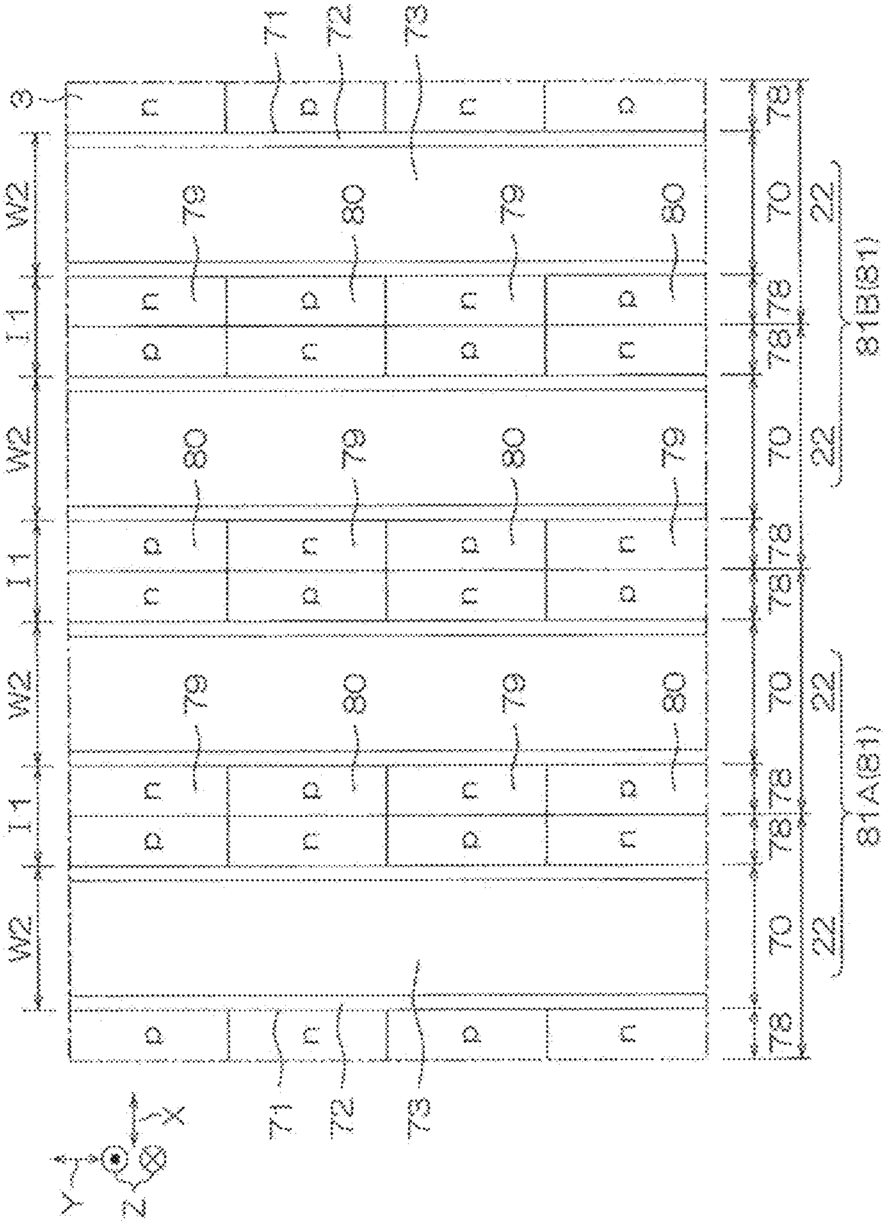
FIG. 7 is an enlarged plan view of a further main part of the output region shown in FIG. 5.
Figure 8:
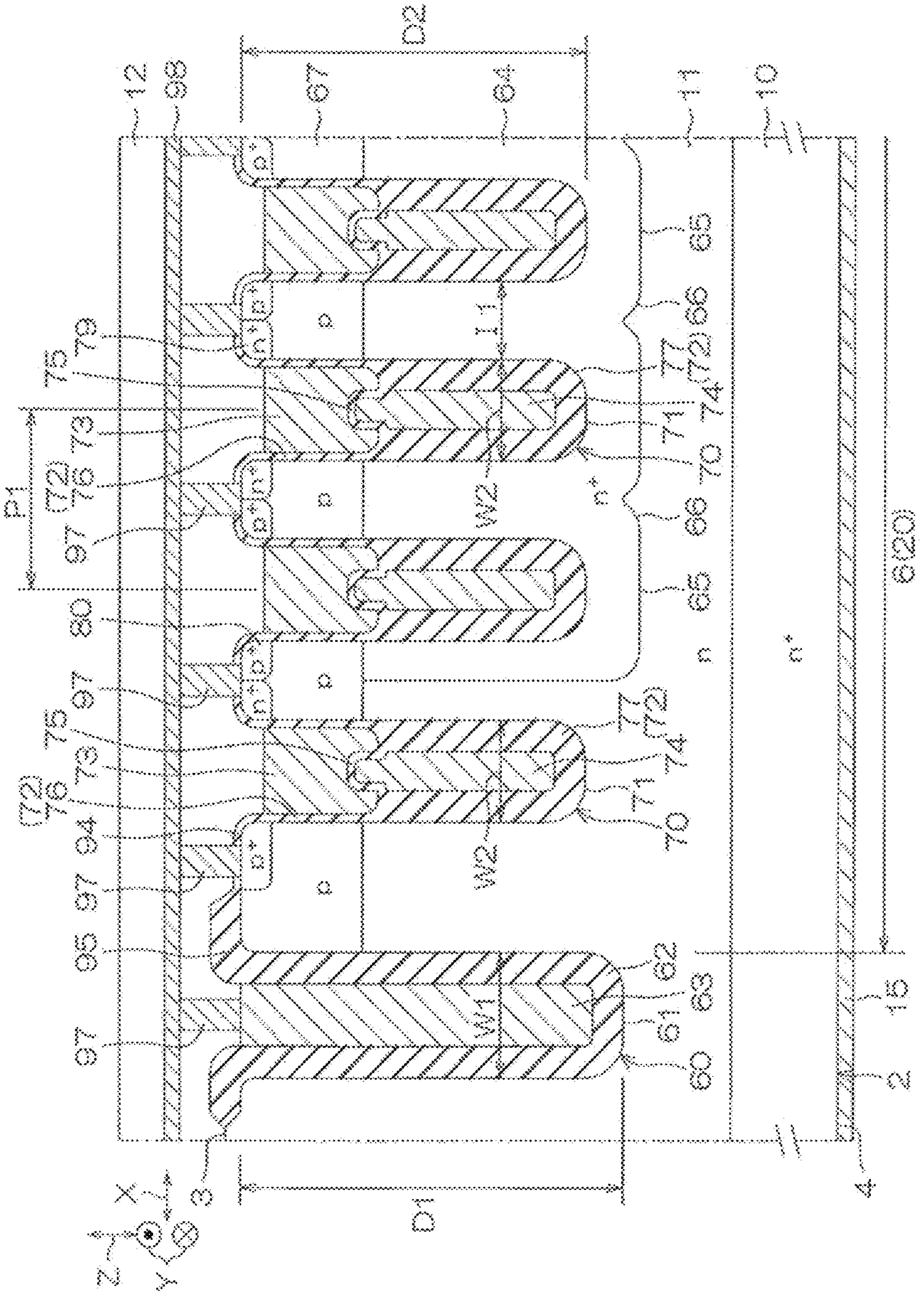
FIG. 8 is a cross-sectional view along a section line VIII-VIII in FIG. 6.
Figure 9:
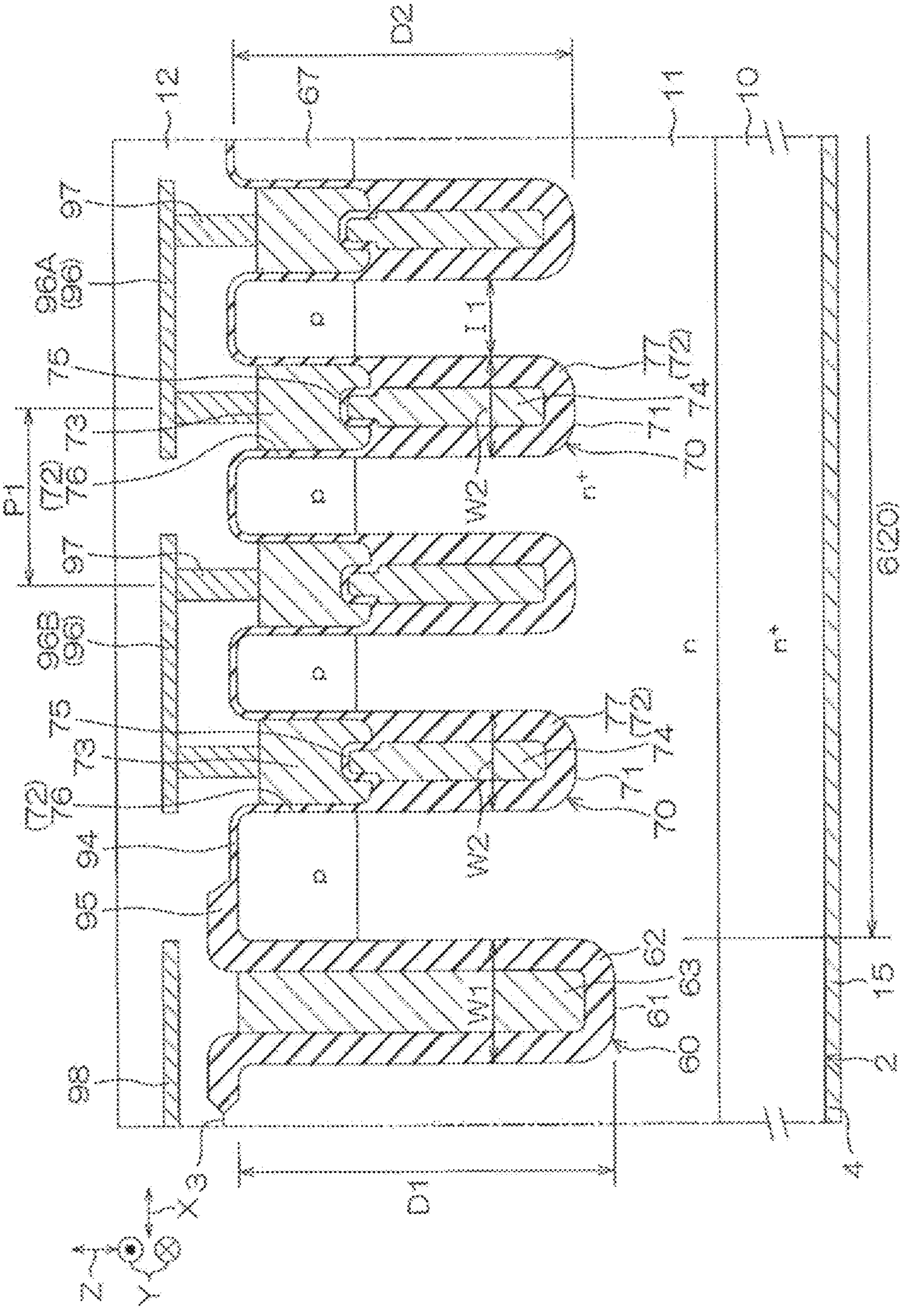
FIG. 9 is a cross-sectional view along a section line IX-IX in FIG. 6.
Figure 10:
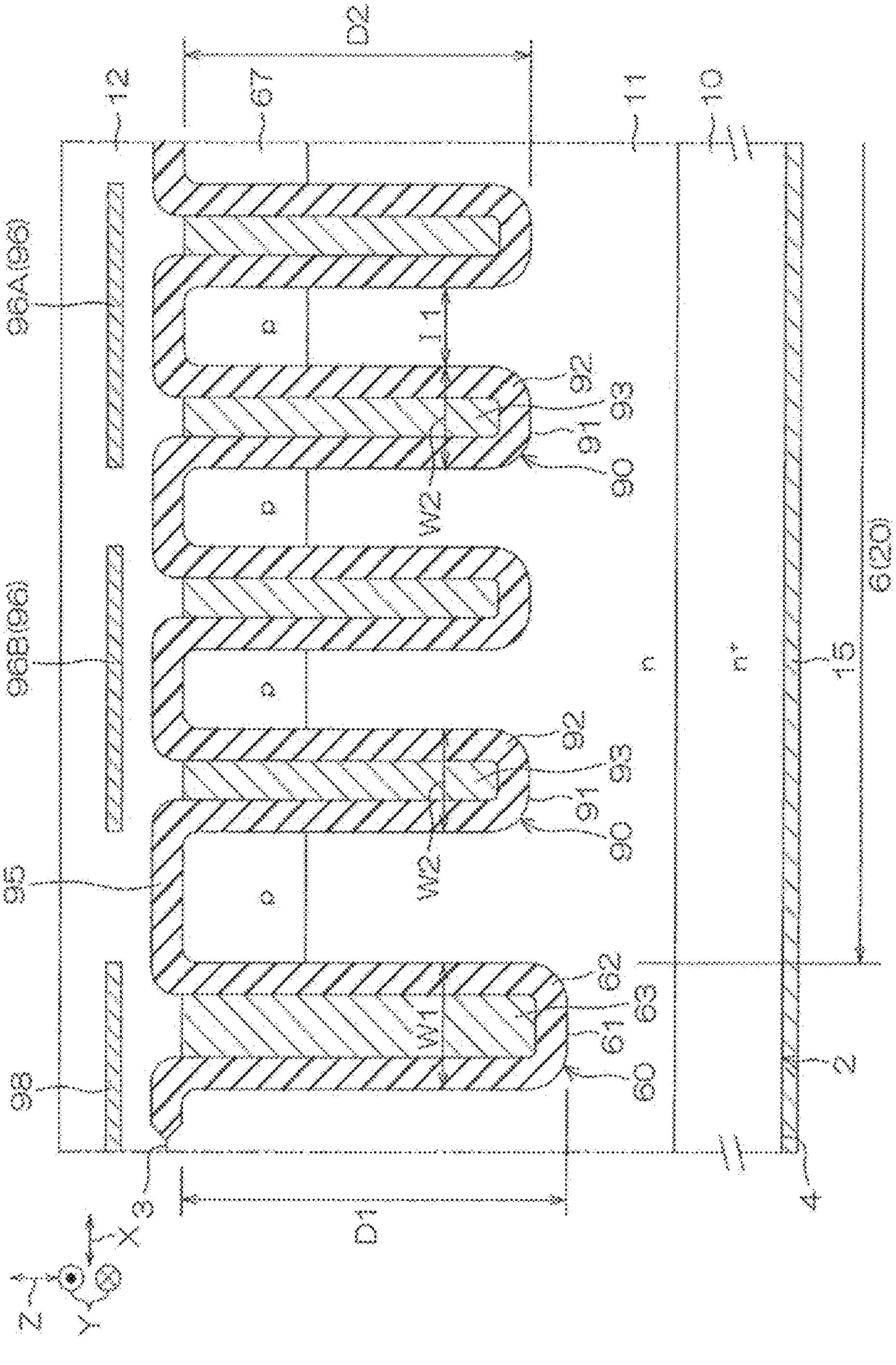
FIG. 10 is a cross-sectional view along a section line X-X in FIG. 6.
Figure 11:
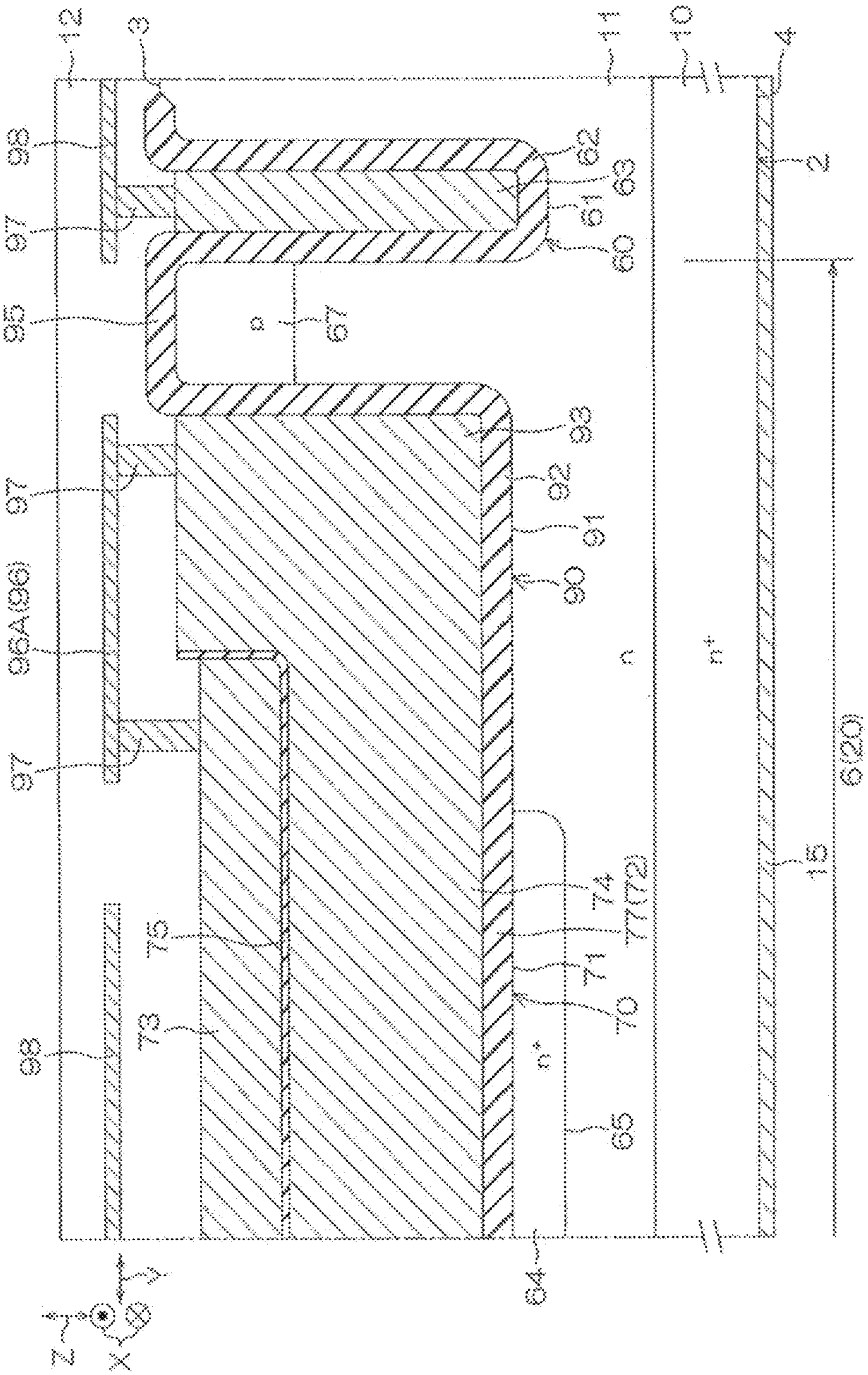
FIG. 11 is a cross-sectional view along a section line XI-XI in FIG. 6.
Figure 12:
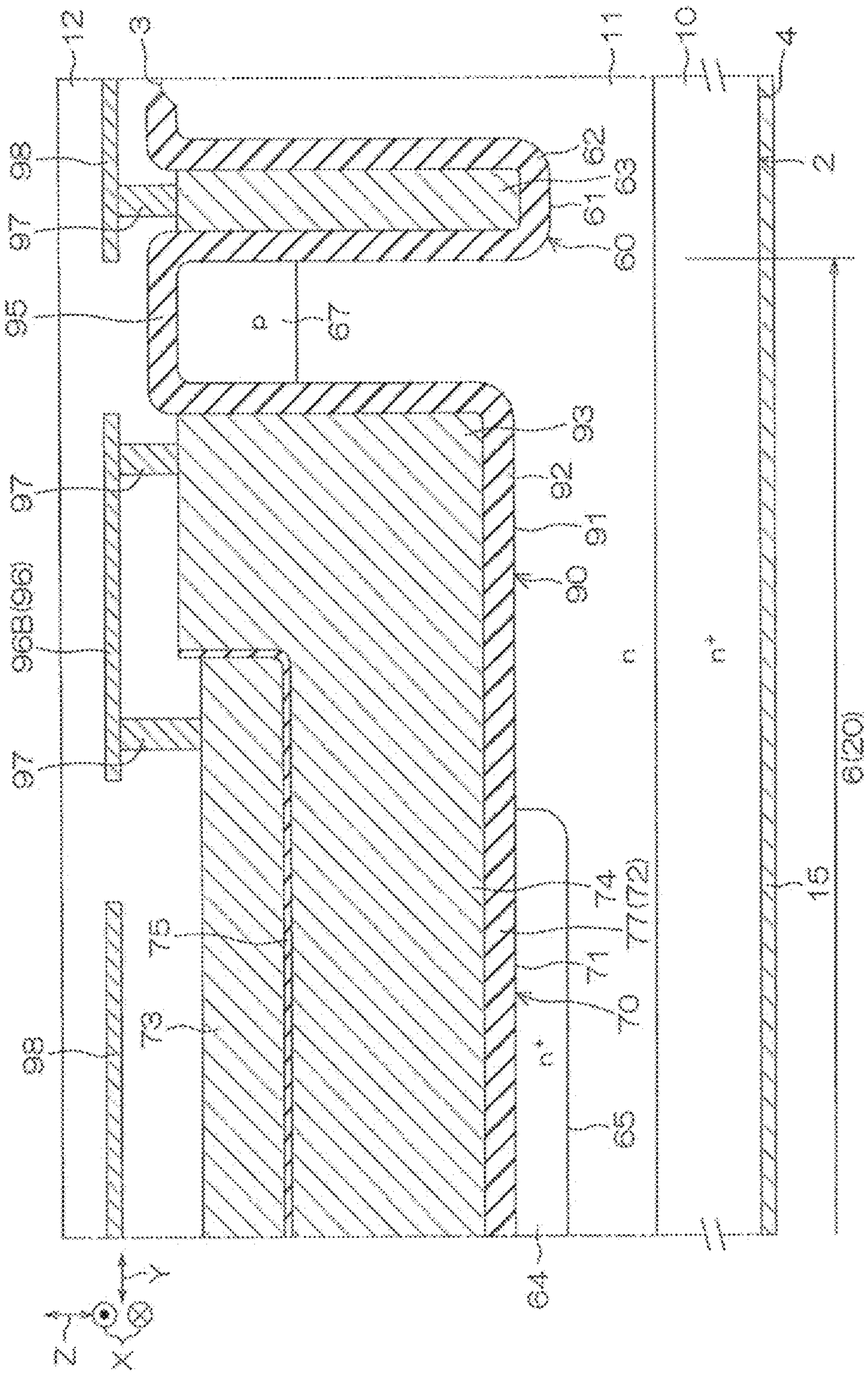
FIG. 12 is a cross-sectional view along a section line XII-XII in FIG. 6.

With reference to FIG. 5 to FIG. 12, the configuration on the side of the output region 6 is described below. FIG. 5 shows a plan view of the output region 6 shown in FIG. 1. FIG. 6 shows an enlarged plan view of a main part of the output region 6 shown in FIG. 5. FIG. 7 shows an enlarged plan view of a further main part of the output region 6 shown in FIG. 5. FIG. 8 shows a cross-sectional view along a section line VIII-VIII in FIG. 6. FIG. 9 shows a cross-sectional view along a section line IX-IX in FIG. 6. FIG. 10 shows a cross-sectional view along a section line X-X in FIG. 6. FIG. 11 shows a cross-sectional view along a section line XI-XI in FIG. 6. FIG. 12 shows a cross-sectional view along a section line XII-XII in FIG. 6.

The semiconductor device 1 includes a first trench isolation structure 60 formed on the first main surface 3 to define and form the output region 6. The first trench isolation structure 60 isolates the output region 6 and the control region 7 in the chip 2. A source potential is applied to the first trench isolation structure 60.

The first trench isolation structure 60 is formed in a loop shape surrounding the output region 6 in the plan view. In this embodiment, the first trench isolation structure 60 is formed to have a polygonal shape (a quadrilateral shape in this embodiment) with four sides parallel to the periphery of the first main surface 3 in the plan view. The first trench isolation structure 60 is formed at an interval from a bottom of the drift region 11 to the side of the first main surface 3, and is separated by a part of the drift region 11 to face the drain region 10.

The first trench isolation structure 60 has a first width W1. The first width W1 is a width in a direction perpendicular to an extension direction of the first trench isolation structure 60. The first width W1 can be between 0.4 μm and 2.5 μm. The first width W1 can be any value within a range between 0.4 μm and 0.75 μm, between 0.75 μm and 1 μm, between 1 μm and 1.25 μm, between 1.25 and 1.5 μm, between 1.5 μm and 1.75 μm, and between 1.75 μm and 2 μm. The first width W1 is preferably between 1.25 μm and 1.75 μm.

The first trench isolation structure 60 has a first depth D1. The first depth D1 can be between 1 μm and 6 μm. The first depth D1 can be any value within a range between 1 μm and 2 μm, between 2 μm and 3 μm, between 3 μm and 4 μm, between 4 and 5 μm, and between 5 μm and 6 μm. The first depth D1 is preferably between 3 μm and 5 μm.

An aspect ratio D1/W1 of the first trench isolation structure 60 can be between 1 and 5. The aspect ratio D1/W1 is a ratio of the first depth D1 to the first width W1. The aspect ratio D1/W1 is preferably 2 or more.

The first trench isolation structure 60 includes an isolation trench 61, an isolation insulating film 62 and an isolation electrode 63. That is, the first trench isolation structure 60 has a single electrode structure, which includes one single electrode (the isolation electrode 63) separated by an insulator (the isolation insulating film 62) and buried in the isolation trench 61. The first trench isolation structure 60 can also be referred to as a deep trench isolation (DTI) structure.

The isolation trench 61 is formed on the first main surface 3, and defines and forms a wall surface of the first trench isolation structure 60. The isolation insulating film 62 covers a wall surface of the isolation trench 61. The isolation insulating film 62 can include a silicon oxide film. The isolation insulating film 62 can include a silicon oxide film formed by an oxide of the chip 2, or can include a silicon oxide film formed by means of chemical vapor deposition (CVD). The isolation electrode 63 is separated by the isolation insulating film 62 and buried in the isolation trench 61. The isolation electrode 63 can include a conductive polycrystalline silicon.

The semiconductor device 1 includes the output transistor 20 formed on the first main surface 3 in the output region 6. The configuration below is described as constituting elements of the semiconductor device 1; however, it is also the constituting elements of the output transistor 20.

The semiconductor device 1 includes an n-type high-concentration drift region 64 formed on a surface layer of the drift region 11 in the output region 6. The high-concentration drift region 64 has an n-type impurity concentration higher than that of the drift region 11. The n-type impurity concentration of the high-concentration drift region 64 can be less than the n-type impurity concentration of the drain region 10. The n-type impurity concentration of the high-concentration drift region 64 can be between $1\times10^{16}$ $cm^{-3}$ and $1\times10^{19}$ $cm^{-3}$. The high-concentration drift region 64 can be regarded as a high-concentration portion of the drift region 11.

The high-concentration drift region 64 is formed to have a concentration gradient such that, within the drift region 11, the n-type impurity concentration increases from the bottom of the drift region 11 toward the side of the first main surface 3. That is, the drift region 11 of the output region 6 is formed to have a concentration gradient such that the n-type impurity concentration increases from the side of the bottom toward the side of the first main surface 3 by means of the high-concentration drift region 64.

The high-concentration drift region 64 is formed at an interval from the first trench isolation structure 60 on an inner side of the output region 6. Thus, the high-concentration drift region 64 is surrounded by the drift region 11 in the output region 6, and is not in contact with the first trench isolation structure 60. The high-concentration drift region 64 locally increases the n-type impurity concentration of the drift region 11 in the output region 6.

The high-concentration drift region 64 is formed at an interval from the bottom of the drift region 11 to the side of the first main surface 3, and is separated by a part of the drift region 11 to face the drain region 10. The high-concentration drift region 64 has a bottom located closer to a side of the bottom of the drift region 11 than a bottom wall of the first trench isolation structure 60. The bottom of the high-concentration drift region 64 winds toward one side and the other side in the thickness direction in a cross-sectional view.

More specifically, the bottom of the high-concentration drift region 64 has multiple protrusions 65 and multiple recesses 66 in a cross-sectional view. The multiple protrusions 65 are portions protruding as arcs toward the side of the bottom of the drift region 11. The multiple protrusions 65 are formed to be continuous in the first direction X in the plan view, and are respectively formed as strips extending in the second direction Y. Each of the protrusions 65 is formed to be wider than the first trench isolation structure 60 in the first direction X.

The multiple recesses 66 are respectively formed as strips extending in the second direction Y in regions between the multiple protrusions 65. The multiple recesses 66 are portions formed by connected shallow parts of the multiple protrusions 65, and are located on the side of the first main surface 3 relative to a deepest part of the multiple protrusions 65. As a matter of course, the high-concentration drift region 65 can also include a flat bottom that does not have any part winding upward in the thickness direction.

The high-concentration drift region 64 can also make the drift region 11 in the output region 6 to have a high concentration globally. With the configuration above, the high concentration of the drift region 11 can reduce the on-resistance of the drift region 11. However, it should be noted that, in this case, an increase in a carrier density in the drift region 11 can easily result in electric field concentration in a way that a breakdown voltage can be decreased as well. Thus, in the aim of suppressing the breakdown voltage from decreasing as well as reducing the on-resistance, it is preferable to introduce the high-concentration drift region 64 to only a portion of the output region 6.

The semiconductor device 1 includes a p-type (a second conductivity type) high-concentration main region 67 formed on the surface layer of the drift region 11 in the output region 6. The main region 67 extends as a layer globally in the output region 6 along the first main surface 3, and is connected to the wall surface of the first trench isolation structure 60. That is, in this embodiment, the main region 67 is not formed in a region outside the first trench isolation structure 60.

The main region 67 is formed to be shallower than the high-concentration drift region 64. More specifically, the main region 67 is formed to be shallower than the first trench isolation structure 60, and has a bottom located closer to the side of the first main surface 3 than the bottom wall of the first trench isolation structure 60. The bottom of the main region 67 is preferably located closer to the side of the first main surface 3 than a middle part of a depth range of the first trench isolation structure 60.

The semiconductor device 1 includes multiple trench gate structures 70 formed on the first main surface 3 in the output region 6. The multiple trench gate structures 70 are formed at an interval from the first trench isolation structure 60 on an inner side of the output region 6. The multiple trench gate structures 70 are arranged at intervals in the first direction X, and are respectively formed as strips along the second direction Y. That is, the multiple trench gate structures 70 are arranged as strips extending in the second direction Y. Referring to FIG. 6, the multiple trench gate structures 70 horizontally cross one end portion and the other end portion of the high-concentration drift region 64 in a lengthwise direction (the second direction Y).

Referring to FIG. 6, each of the multiple trench gate structures 70 has a first end portion on one side of the lengthwise direction (the second direction Y) and a second end portion on the other side of the lengthwise direction (the second direction Y). The first end portion is a region located between the first trench isolation structure 60 and one end portion of the high-concentration drift region 64 in the plan view. The second end portion is a region located between the first trench isolation structure 60 and the other end portion of the high-concentration drift region 64 in the plan view.

The multiple trench gate structures 70 pass through the main region 67 in the plan view, and are located within the high-concentration drift region 64. The multiple trench gate structures 70 are formed at an interval from the bottom of the drift region 64 to the side of the first main surface 3, and are separated by a part of the high-concentration drift region 64 to face the drain region 11.

The multiple trench gate structures 70 are staggered in the first direction X relative to the multiple recesses 66, and respectively face the multiple recesses 66 in the thickness direction. The multiple trench gate structures 70 preferably face deepest parts of the multiple recesses 66. Such configuration is obtained by introducing an n-type impurity into the chip 2 from wall surfaces of multiple gate trenches 71 after a process of forming the multiple gate trenches 71.

The two trench gate structures 70 located on both sides of the first direction X are preferably formed in a region outside of the high-concentration drift region 64. That is, the outermost trench gate structure 70 preferably passes through the main region 67 from the high-concentration drift region 64 toward a position separated from the first trench isolation structure 60, and is located within the drift region 11. The outermost trench gate structure 70 is formed at an interval from the bottom of the drift region 11 to the side of the first main surface 3, and is separated by a part of the drift region 11 to face the drain region 10.

The multiple trench gate structures 70 have a second width W2. The second width W2 is a width in a direction perpendicular (that is, the first direction X) to an extension direction of the trench gate structures 70. The second width W2 can be substantially equal to the first width W1 of the first trench isolation structure 60. The second width W2 is preferably less than the first width W1. The second width W2 is more preferably less than the first width W1.

The second width W2 can be between 0.4 μm and 2 μm. The second width W2 can be any value within a range between 0.4 μm and 0.75 μm, between 0.75 μm and 1 μm, between 1 μm and 1.25 μm, between 1.25 and 1.5 μm, between 1.5 μm and 1.75 μm, and between 1.75 μm and 2 μm. The second width W2 is preferably between 0.8 μm and 1.2 μm.

The multiple trench gate structures 70 are arranged at a first interval I1 in the first direction X. The first interval I1 is a platform width (a first platform width) of a platform (a first platform) defined and formed in a region between two adjacent trench gate structures 70. The first interval I1 is preferably less than the first width W1 of the first trench isolation structure 60. The first interval I1 is preferably less than the second width W2. The first interval I1 is more preferably less than the second width W2.

The first interval I1 can be between 0.4 μm and 0.8 μm. The first interval I1 can be any value within a range between 0.4 μm and 0.5 μm, between 0.5 μm and 0.6 μm, between 0.6 μm and 0.7 μm, and between 0.7 μm and 0.8 μm. The first interval I1 is preferably between 0.5 μm and 0.7 μm.

The trench gate structures 70 have a second depth D2. The second depth D2 can be substantially equal to the first depth D1 of the first trench isolation structure 60. The second depth D2 is preferably less than the first depth D1. The second depth D2 is more preferably less than the first depth D1.

The second depth D2 can be between 1 μm and 6 μm. The second depth D2 can be any value within a range between 1 μm and 2 μm, between 2 μm and 3 μm, between 3 μm and 4 μm, between 4 and 5 μm, and between 5 μm and 6 μm. The second depth D2 is preferably between 2.5 μm and 4.5 μm.

A pitch P1 of the trench gate structures 70 can be between 1.0 μm and 2.0 μm. The pitch P1 can be any value within a range between 1.2 μm and 2.0 μm, between 1.2 μm and 1.8 μm, between 1.0 μm and 1.8 μm, and between 1.0 μm and 1.5 μm. The pitch P1 an also be said as a distance between centers of adjacent trench gate structures 70.

An internal configuration of one trench gate structure 70 is described below. Similar to the first trench isolation structure 60, the trench gate structure 70 can also be referred to as a deep trench isolation (DTI) structure. That is, an aspect ratio D2/W2 of the trench gate structure 70 can be between 1 and 5. The aspect ratio D2/W2 is a ratio of the second depth D2 to the second width W2. The aspect ratio D2/W2 is preferably 2 or more.

More specifically, the trench gate structure 70 includes a gate trench 71, an insulating film 72, an upper electrode 73, a lower electrode 74 and an intermediate insulating film 75. That is, the trench gate structure 70 includes a multi-electrodes structure. The multi-electrode structure includes multiple electrodes (the upper electrode 73 and the lower electrode 74) buried in the gate trench 71 by a manner of vertical insulation and separation by an insulator (the insulating film 72 and the intermediate insulating film 75).

The gate trench 71 is formed on the first main surface 3, and defines and forms a wall surface of the gate trench structure 70. The insulating film 72 covers a wall surface of the gate trench 71. The insulating film 72 includes an upper insulating film 76 and a lower insulating film 77.

The upper insulating film 76 covers the wall surface on the opening side of the gate trench 71 relative to the bottom of the main region 67.

The upper insulating film 76 partially covers the wall surface on the side of a bottom wall of the gate trench 71 relative to the bottom of the main region 67. The upper insulating film 76 is thinner than the insulating film 62. The upper insulating film 76 is formed to serve as a gate insulating film. The upper insulating film 76 can include a silicon oxide film. The upper insulating film 76 preferably includes a silicon oxide film formed by an oxide of the chip 2.

The lower insulating film 77 covers the wall surface on the side of a bottom wall of the gate trench 71 relative to the bottom of the main region 67. The lower insulating film 77 is thicker than the upper insulating film 76. A thickness of the lower insulating film can be substantially equal to the thickness of the isolation insulating film 62. The lower insulating film 77 can include a silicon oxide film. The lower insulating film 77 can include a silicon oxide film formed by an oxide of the chip 2, or can include a silicon oxide film formed by means of CVD.

The upper electrode 73 is separated by the insulating film 72 and buried on the opening side of the gate trench 71. More specifically, the upper electrode 73 is separated by the upper insulating film 76 and buried on an opening side of the gate trench 71, and is separated by the upper insulating film 76 to face the main region 67 and the high-concentration drift region 64. The upper electrode 73 can include a conductive polycrystalline silicon.

The lower electrode 74 is separated by the insulating film 72 and buried on the side of the bottom wall of the gate trench 71. More specifically, the lower electrode 74 is separated by the lower insulating film 77 and buried on the side of the bottom wall of the gate trench 71, and is separated by the lower insulating film 77 to face the high-concentration drift region 64. The lower electrode 74 of the outermost trench gate structure 70 is separated by the lower insulating film 77 to face the drift region 11.

The lower electrode 74 has an upper end portion protruded from the lower insulating film 77 toward the upper electrode 73 so as to be engaged with a bottom of the upper electrode 73. The upper end portion of the lower electrode 74 is separated by a lower end portion of the upper electrode 73 along a horizontal direction of the first main surface 3 to face the insulating film 76. The lower electrode 74 can include a conductive polycrystalline silicon.

The intermediate insulating film 75 is interposed between the upper electrode 73 and the lower electrode 74, and electrically insulates the upper electrode 73 and the lower electrode 74 in the gate trench 71. The intermediate insulating film 75 is connected to the upper insulating film 76 and the lower insulating film 77. The intermediate insulating film 75 is thinner than the lower insulating film 77. The intermediate insulating film 75 can include a silicon oxide film. The intermediate insulating film 75 preferably includes a silicon oxide film formed by an oxide of the lower electrode 74.

Referring to FIG. 6 and FIG. 7, the semiconductor device 1 includes multiple channel units 78 serving as control targets of the trench gate structures 70 and formed on both sides of the trench gate structures 70. In this embodiment, two channel units 78 disposed on both sides of one trench gate structure 70 are controlled by the one trench gate structure 70, and are excluded from the control targets of the remaining trench gate structures 70.

The multiple channel units 78 are separated at intervals from two end portions of the trench gate structures 70 in the lengthwise direction (the second direction Y), and are formed in a region along an inner portion of the trench gate structures 70. The multiple channel units 78 expose the main region 67 from a region sandwiched by two end portions of the multiple trench gate structures 70 in the first main surface 3.

The multiple channel units 78 are separated by a part of the main region 67 in the thickness direction to face the high-concentration drift region 64. The multiple channel units 78 are preferably formed closer to an inner portion of the high-concentration drift region 64 than a periphery of the high-concentration drift region 64 in the plan view.

Each of the channel units 78 includes multiple n-type source regions 79 and multiple p-type contact regions 80. In FIG. 6, for the sake of clarity, the source regions 79 are shaded by lines. The contact regions 80 can also be referred to as "back gate regions". The source regions 79 have an n-type impurity concentration higher than that of the drift region 11. The source regions 79 can also have an n-type impurity concentration higher than that of the high-concentration drift region 64. The n-type impurity concentration of the source regions 10 can be between $1\times10^{18}$ cm$^{-3}$ and $1\times10^{21}$ cm$^{-3}$.

The multiple source regions 79 are arranged at intervals along the trench gate structures 70. The multiple source regions 79 are formed at an interval from the bottom of the main region 67 to the side of the first main surface 3, and are separated by the insulating film 72 (the upper insulating film 76) to face the upper electrode 73.

The contact regions 80 have a p-type impurity concentration higher than that of the main region 67. The p-type impurity concentration of the contact regions 80 can be between $1\times10^{18}$ cm$^{-3}$ and $1\times10^{21}$ cm$^{-3}$. The multiple contact regions 80 are arranged alternately with multiple source regions 79 along the trench gate structures 70. The multiple contact regions 80 are formed at an interval from the bottom of the main region 67 to the side of the first main surface 3, and are separated by the insulating film 72 (the upper insulating film 76) to face the upper electrode 73.

Regarding the two channel units 78 formed on two sides of one trench gate structure 70, the multiple source regions 79 in one channel unit 78 are separated by the trench gate structure 70 to face the multiple source regions 79 in the other channel unit 78. Moreover, the multiple contact regions 80 in one channel unit 78 are separated by the trench gate structure 70 to face the multiple contact regions 80 in the other channel unit 78.

As matter of course, the multiple source regions 79 in one channel unit 78 can also be separated by the trench gate structure 70 to face the multiple contact regions 80 in the other channel unit 78. Moreover, the multiple contact regions 80 in one channel unit 78 can also be separated by the trench gate structure 70 to face the multiple source regions 79 in the other channel unit 78.

Regarding the two channel units 78 interposed between two trench gate structures 70, the multiple source regions 79 in one channel unit 78 are connected to the multiple contact regions 80 in the other channel unit 78 in the first direction X. Moreover, the multiple contact regions 80 in one channel unit 78 are connected to the multiple source regions 79 in the other channel unit 78 in the first direction X.

As matter of course, the multiple source regions 79 in one channel unit 78 can also be connected to the multiple source regions 79 in the other channel unit 78 in the first direction X. Moreover, the multiple contact regions 80 in one channel unit 78 can also be connected to the multiple contact regions 80 in the other channel unit 78 in the first direction X.

Between the two channel units 78 formed on both sides of the outermost trench gate structure 70, the inner channel unit 78 is separated by a part of the main region 67 in the thickness direction to face the drift region 11. The outer channel unit 78 does not include the source region 79 but includes only the contact region 80. Accordingly, a current path is inhibited from forming in a region between the first trench isolation structure 60 and the outermost trench gate structure 70.

Referring to FIG. 7, the output transistor 20 includes multiple unit transistors 22. Each of the multiple unit transistors 22 includes one trench gate structure 70, and two channel units 78 formed on both sides of the one trench gate structure 70. Regarding each of the unit transistors 22, one trench gate structure 70 forms a unit gate, the multiple source regions 79 (two channel units 78) form a unit source, and the drain region 10 (the drift region 11 and the high-concentration drain region 64) forms a unit drain.

As shown in FIG. 3 and FIG. 4, the output transistor 22 includes the first system transistor 21A and the second system transistor 21B. The first system transistor 21A includes multiple unit transistors 22 serving as multiple unit transistors 22 that are systemized (grouped) and then used as individual control objects. The second system transistor 21B includes multiple unit transistors 22 other than those of the first system transistors 21A and serving as multiple unit transistors 22 that are systemized (grouped) and then used as individual control objects.

In this embodiment, the output transistor 22 includes multiple block regions 81 disposed in the output region 6. The multiple block regions 81 include multiple first block regions 81A and multiple second block regions 81B. The multiple first block regions 81A are regions for respectively disposing one or more (multiple in this embodiment) unit transistors 22 for the first system transistor 21A. The multiple second block regions 81B are regions for respectively disposing one or more (multiple in this embodiment) unit transistors 22 for the second system transistor 21B.

The multiple first block regions 81A are arranged at intervals in the first direction X. The number of the unit transistors 22 in each of the first block regions 81A can be any as desired. In this embodiment, two unit transistors 22 are disposed in each of the first block regions 81A. An amount of heat generated in each of the first block region 81A increases if the number of the unit transistors 22 in each of the first block regions 81A increases. Thus, the number of the unit transistors 22 in each of the first block regions 81A is preferably between 2 and 5.

The multiple second block regions 81B are arranged alternately with the multiple first block regions 81A to sandwich one first block region 81A in the first direction X. Accordingly, heat generating portions caused by the multiple first block regions 81A can be further distanced by the multiple second block regions 81B, and meanwhile heat generating portions caused by the multiple second block regions 81B can be further distanced by the multiple first block regions 81A.

The number of the unit transistors 22 in each of the second block regions 81B can be any as desired. In this embodiment, the number of the unit transistors 22 in each of the second block regions 81B is two. An amount of heat generated in each of the second block region 81B increases if the number of the unit transistors 22 in each of the second block regions 81B increases.

Thus, the number of the unit transistors 22 in each of the second block regions 81B is preferably between 2 and 5. In view of an in-plane temperature difference in the output region 6, the number of the unit transistors 22 in the second block regions 81B is preferably equal to the number of the unit transistors 22 in the first block regions 81A.

The semiconductor device 1 includes a pair of trench connection structure 90 connecting two end portions of multiple (two in this embodiment) trench gate structures 70 that should be systemized (grouped) in each of the block regions 81. That is, one pair of trench connection structures 90 respectively connect two end portions of multiple trench gate structures 70 that should be systemized to serve as the system transistor 21.

The trench connection structure 90 on one side connects the first end portions of the corresponding multiple (two in this embodiment) trench gate structures 70 with each other in a bow-shape in the plan view. The trench connection structure 90 on the other side connects the second end portions of the corresponding multiple (two in this embodiment) trench gate structures 70 with each other in a bow-shape in the plan view.

More specifically, the trench connection structure 90 on one side has a first portion extending in the first direction X, and multiple (two in this embodiment) second portions extending in the second direction Y. The first portion faces the first end portions of the multiple trench gate structures 70 in the plan view. The multiple second portions extend from the first portion toward the multiple first end portions so as to connect to the multiple first end portions.

The trench connection structure 90 on the other side has a first portion extending in the first direction X, and multiple (two in this embodiment) second portions extending in the second direction Y. The first portion faces the second end portions of the multiple trench gate structures 70 in the plan view. The multiple second portions extend from the first portion toward the multiple second end portions so as to connect to the multiple second end portions. The multiple trench connection structures 90 form the multiple trench gate structures 70 and one loop-shaped or stepped trench structure in each of the block regions 81.

The multiple trench connection structures 90 are separated from the first trench isolation structure 60 and the high-concentration drift region 64, and are formed in a region between the first trench isolation structure 60 and the high-concentration drift region 64. The multiple trench connection structures 90 are formed at an interval from the bottom of the drift region 11 to the side of the first main surface 3, and are separated by a part of the drift region 11 to face the drain region 10.

The multiple trench connection structures 90 can be formed according to a width substantially equal to that and a depth substantially equal that of the trench gate structures 70. As a matter of course, the first portion and the second portions of the trench connection structure 90 can also have different widths. For example, the second portions of the trench connection structure 90 can be formed to be narrower than the first portion of the trench connection structure 90.

In this case, the first portion can have a width substantially equal to the width of the first trench isolation structure 60, and the second portions can have a width substantially equal to the width of the trench gate structures 70. Further, in this case, the first portion can have a depth substantially equal to the depth of the first trench isolation structure 60, and the second portions can have a depth substantially equal to the depth of the trench gate structures 70.

Apart from being connected to the second end portion of the trench gate structure 70, the trench connection structure 90 on the other side has a structure identical to that of the trench connection structure 90 on the one side. The configuration of the trench connection structure 90 on one side is described below, while configuration details of the trench connection structure 90 on the other side are omitted.

The trench connection structure 90 includes a connection trench 91, a connection insulating film 92 and a connection electrode 93. The connection trench 91 is formed on the first main surface 3, and defines and forms a wall surface of the trench connection structure 90. The connection trench 91 is connected to the multiple gate trenches 71.

The connection insulating film 92 covers a wall surface of the connection trench 91. The connection insulating film 92 is connected to the upper insulating film 76, the lower insulating film 77 and the intermediate insulating film 75 at a communication portion of the connection trench 91 and the gate trench 71. The connection insulating film 92 is thicker than the upper insulating film 76. A thickness of the connection insulating film 92 can be substantially equal to a thickness of the lower insulating film 77. The connection insulating film 92 can include a silicon oxide film. The connection insulating film 92 can include a silicon oxide film formed by an oxide of the chip 2, or can include a silicon oxide film formed by means of CVD.

The connection electrode 93 is separated by the connection insulating film 92 and buried in the connection trench 91, and is separated by the connection insulating film 92 to face the drift region 11 and the main region 67. The connection electrode 93 is connected to the lower electrode 74 at the communication portion of the connection trench 91 and the gate trench 71, and is electrically insulated from the upper electrode 73 via the intermediate insulating film 75. The connection electrode 93 is formed by a drawn-out part formed by drawing the lower electrode 74 in the gate trench 71 to the connection trench 91. The connection electrode 93 can include a conductive polycrystalline silicon.

The semiconductor device 1 includes a main surface insulating film 94 selectively covering the first main surface 3 in the output region 6. The main surface insulating film 94 is connected to the insulating film 72 (the upper insulating film 76) and the connection insulating film 92 to expose the isolation electrode 63, the upper electrode 73 and the connection electrode 93.

The main surface insulating film 94 is thinner than the isolation insulating film 62. The main surface insulating film 94 is thinner than the lower insulating film 77. The main surface insulating film 94 is thinner than the connection insulating film 92. The main surface insulating film 94 can have a thickness substantially equal to that of the upper insulating film 76. The main surface insulating film 94 can include a silicon oxide film. The main surface insulating film 94 preferably includes a silicon oxide film formed by an oxide of the chip 2.

The semiconductor device 1 includes a field insulating film 95 selectively covering the first main surface 3 within and outside the output region 6. The field insulating film 95 is thicker than the main surface insulating film 94. The field insulating film 95 is thicker than the upper insulating film 76. The field insulating film 95 can have a thickness substantially equal to that of the isolation insulating film 62. The field insulating film 95 can include a silicon oxide film. The field insulating film 95 can include a silicon oxide film formed by an oxide of the chip 2, or can include a silicon oxide film formed by means of CVD.

The field insulating film 95 covers the first main surface 3 along an inner wall of the first trench isolation structure 60 within the output region 6, and is connected to the isolation insulating film 62, the connection insulating film 92 and the main surface insulating film 94. The field insulating film 95 covers the first main surface 3 along an outer wall of the first trench isolation structure 60 outside the output region 6, and is connected to the isolation insulating film 62.

The interlayer insulating layer 12 covers the first trench isolation structure 60, the trench gate structures 70, the trench connection structures 90, the main surface insulating film 94 and the field insulating film 95 in the output region 6.

The semiconductor device 1 includes multiple gate wirings 96 disposed in the interlayer insulating layer 12. The multiple gate wirings 96 are routed in the output region 6 and the control region 7, are electrically connected to the output transistor 20 in the output region 6, and are electrically connected to the control circuit 23 (the gate control circuit 24) in the control region 7. The multiple gate wirings 96 individually output multiple gate signals generated in the control circuit 23 (the gate control circuit 24) to the output transistor 20.

The multiple gate wirings 96 include a first system gate wiring 96A and a second system gate wiring 96B. The first system gate wiring 96A individually transmits gate signals to the first system transistor 21A. The first system gate wiring 96A is electrically connected to the multiple trench gate structures 70 for the first system transistor 21A via multiple via electrodes 97 disposed in the interlayer insulating layer 12. More specifically, the first system gate wiring 96A is electrically connected to the corresponding multiple upper electrodes 73 and multiple connection electrodes 93 via the multiple via electrodes 97.

That is, the upper electrodes 73 and the lower electrodes 74 for the first system transistor 21A are simultaneously controlled to be on and off by the same gate signal. Accordingly, a voltage drop between the upper electrodes 73 and the lower electrodes 74 is inhibited, hence inhibiting any undesired electric field concentration. As a result, the decrease in the withstand voltage (the breakdown voltage) caused by the electric field concentration can be suppressed.

The second system gate wiring 96B transmits in a manner of electrically separate from the first system gate wiring 96A, gate signals to the second system transistor 21B. The second system gate wiring 96B is electrically connected to the multiple trench gate structures 70 for the second system transistor 21B via the multiple via electrodes 97 disposed in the interlayer insulating layer 12. More specifically, the second system gate wiring 96B is electrically connected to the corresponding multiple upper electrodes 73 and multiple connection electrodes 93 via the multiple via electrodes 97.

That is, the upper electrodes 73 and the lower electrodes 74 for the second system transistor 21B are simultaneously controlled to be on and off by the same gate signal. Accordingly, a voltage drop between the upper electrodes 73 and the lower electrodes 74 is inhibited, hence inhibiting any undesired electric field concentration. As a result, the decrease in the withstand voltage (the breakdown voltage) caused by the electric field concentration can be suppressed.

The semiconductor device 1 includes a source wiring 98 disposed in the interlayer insulating layer 12. The source wiring 98 is electrically connected to the source terminal 13, the first trench isolation structure 60 and the multiple channel units 78. More specifically, the source wiring 98 is electrically connected to the first trench isolation structure 60 and the multiple channel units 78 via the multiple via electrodes 97 disposed in the interlayer insulating layer 12.

The via electrodes 97 for each of the channel units 78 are disposed to cross two adjacent channel units 78, and are formed as strips extending along each of the channel units 78 in the plan view. Accordingly, the source terminal 13 is electrically connected to the system sources (the unit sources of the unit transistors 22) of all the system transistors 21.

[Element Having STI Structure]

Figure 13:
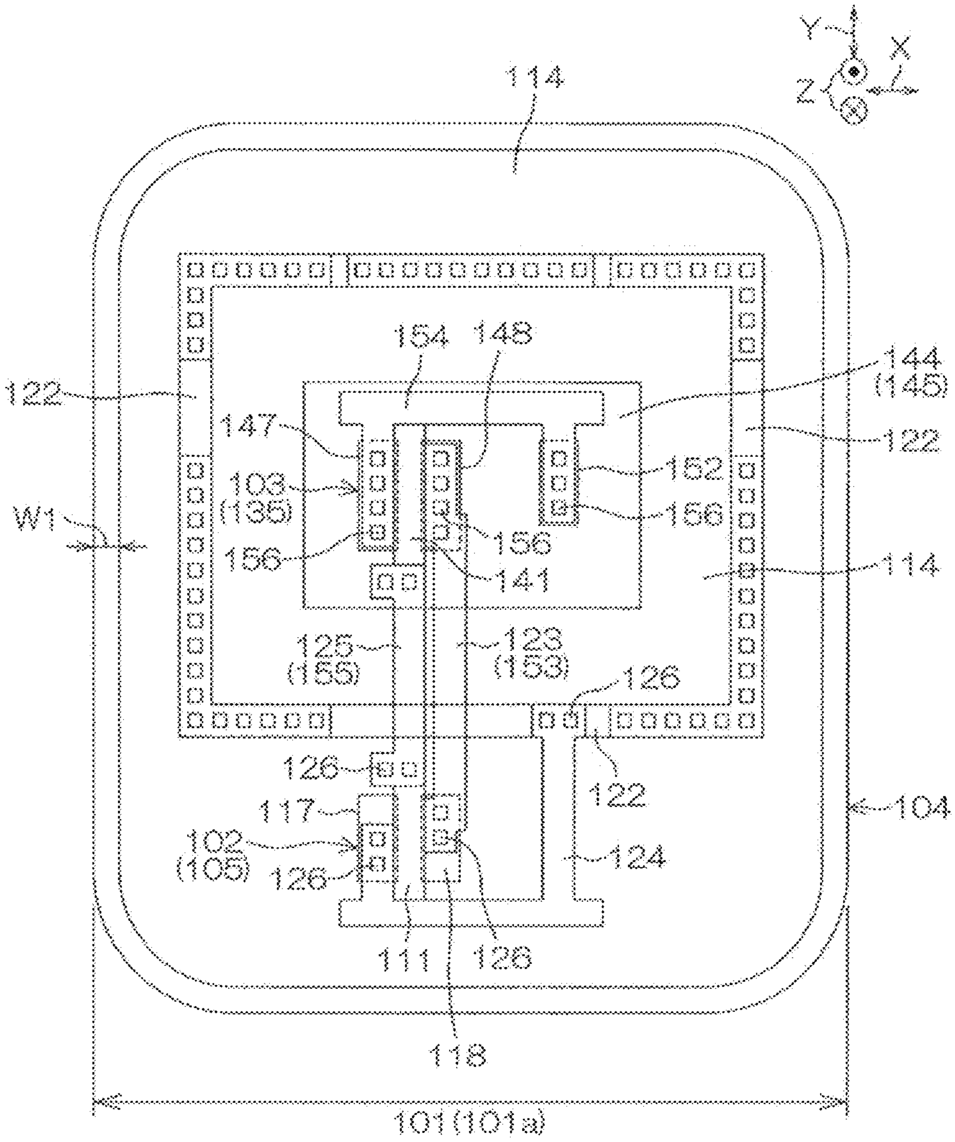
FIG. 13 is a plan view of a logic circuit region shown in FIG. 1.
Figure 14:
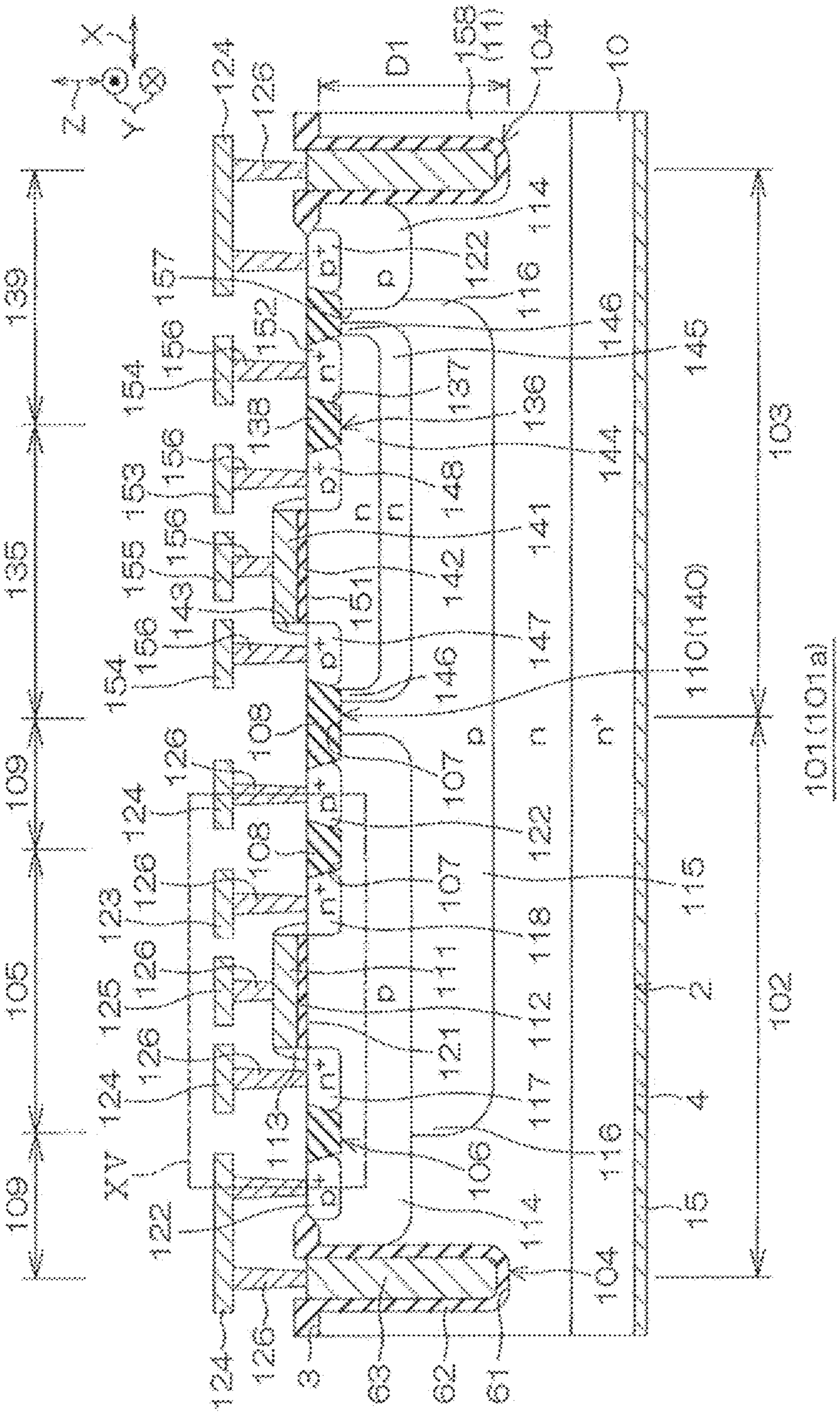
FIG. 14 is a schematic cross-sectional view of the logic circuit region in FIG. 13.
Figure 15:
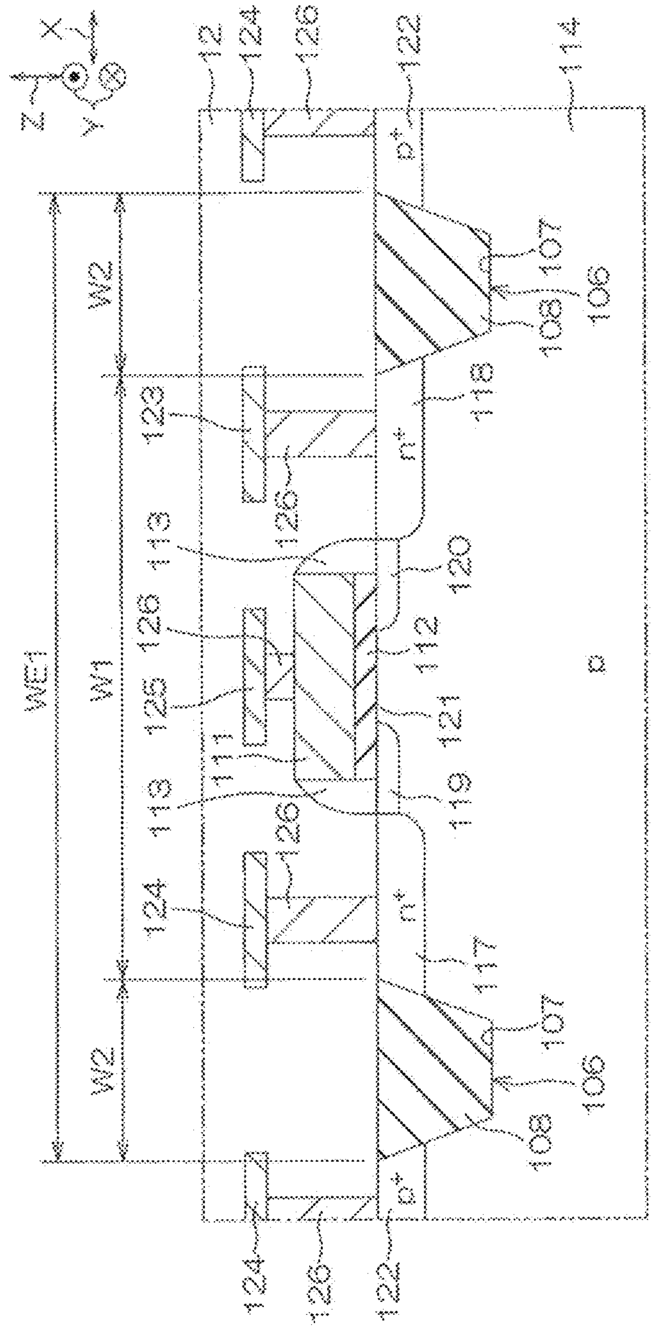
FIG. 15 is an enlarged diagram of a region XV shown in FIG. 14.

With reference to FIG. 13 to FIG. 15, the configuration of a first circuit region 101 in which the logic circuit 32 is formed on the side of the control region 7 is described below. FIG. 13 shows a plan view of the first circuit region 101 in which the logic circuit 32 shown in FIG. 1 is formed. FIG. 14 show a schematic cross-sectional view of the first circuit region 101 in FIG. 13. FIG. 14 does not exhibit a cross-sectional view of the plan view of FIG. 13 along a specific section line, but is a schematic diagram showing cross-section structures of various configurations in the first circuit region 101. FIG. 15 shows an enlarged diagram of a region XV in FIG. 14. The first circuit region 101 can also be referred to as a logic circuit region.

Referring to FIG. 13 to FIG. 15, the semiconductor device 1 includes the first circuit region 101 formed by defining the control region 7 on the first main surface 3. The first circuit region 101 is a region applied with a voltage (a potential) different from that of the output region 6 and is a region in which a circuit of multiple electronic circuits (electronic devices) is formed, wherein the circuit is, for example, a complementary metal insulator semiconductor (CMIS) transistor 101*a* as a first CMIS transistor.

More specifically, the CMIS 101*a* includes an n-type first MISFET 102 (a first n-type MIS transistor) and a p-type second MISFET 103 (a first p-type MIS transistor) that are complementarily connected. The first MISFET 102 is driven and controlled by a voltage application condition different from that of the output transistor 20. The second MISFET 103 is driven and controlled by a voltage application condition different from those of the output transistor 20 and the first MISFET 102. Moreover, the n-type first MISFET 102 and the p-type second MISFET 103 can be combined in complementary as this embodiment, or can be formed as independent elements from each other.

A rated voltage (a first rated voltage) of the first MISFET 102 and the second MISFET 103 can be, for example, between 1.0 V and 8.0 V.

The rated voltage of the first MISFET 102 and the second MISFET 103 can be defined to be within a range of a maximum tolerance of a voltage applied between the source and the drain of the first MISFET 102 and the second MISFET 103. The rated voltage of the first MISFET 102 and the second MISFET 103 can also be referred to as a withstand voltage of the first MISFET 102 and the second MISFET 103.

The specific structure in the first circuit region 101 is described below.

The semiconductor device 1 includes a second trench isolation structure 104 formed on the first main surface 3 to define and form the first circuit region 101. The first circuit region 101 is a device region controlled by a voltage application condition different from that of the output region 6. The second trench isolation structure 104 can also be referred to as a deep trench isolation (DTI) structure.

The second trench isolation structure 104 is formed to have a loop shape surrounding a partial region of the first main surface 3 in the plan view, and defines and forms the first circuit region 101 in a predetermined shape. In this embodiment, the second trench isolation structure 104 is formed to have a polygonal shape with four sides parallel to the periphery (the first to fourth side surfaces 5A to 5D) of the first main surface 3 in the plan view to define and form the first circuit region 101 having a quadrilateral shape. A planar shape of the second trench isolation structure 104 can be any as desired, and can also be formed to have a polygonal loop shape. The first circuit region 101 can also be defined and formed to have a polygonal loop shape according to the planar shape of the second trench isolation structure 104.

Similar to the first trench isolation structure 60, the second trench isolation structure 104 has the isolation width W1 and the isolation depth D1 (that is, the aspect ratio D1/W1). A bottom wall of the second trench isolation structure 104 is preferably formed at an interval of between 1 μm and 5 μm relative to a bottom of a substrate region 158. The substrate region 158 is integrally connected to the drift region 11, and is formed by an n-type epitaxial layer (a Si epitaxial layer).

The second trench isolation structure 104 has a corner connecting a portion extending in the first direction X and a portion extending in the second direction Y into an arc shape. In this embodiment, four corners of the second trench isolation structure 104 have an arc shape. That is, the first circuit region 101 is defined and formed to have a quadrilateral shape having four corners respectively extending in an arc shape. The corners of the second trench isolation structure 104 preferably have a fixed isolation width W1 along an arc direction.

Similar to the first trench isolation structure 60, the second trench isolation structure 104 has a single electrode structure including the isolation trench 61, the isolation insulating film 62 and the isolation electrode 63. "The isolation trench 61", "the isolation insulating film 62" and "the isolation electrode 63" of the second trench isolation structure 104 can also be referred to as "a second isolation trench", "a second isolation insulating film" and "a second isolation electrode". The description associated with the isolation trench 61, the isolation insulating film 62 and the isolation electrode 63 of the second trench isolation structure 104 are applicable to the isolation trench 61, the isolation insulating film 62 and the isolation electrode 63 of the first trench isolation structure 60, and are omitted herein.

In the first circuit region 101, a first well region 114 is formed on the surface layer of the first main surface 3. The first well region 114 is formed globally on the surface layer of the first main surface 3 in the first circuit region 101, and is in contact with the second trench isolation structure 104.

A first contact region 122 is formed on a surface layer of the first well region 114. The first contact region 122 can also be referred to as "a first back gate region", or "a protection ring region". The first contact region 122 has a p-type impurity concentration higher than a p-type impurity concentration of the first well region 114. The first contact region 122 is formed at an interval from the second trench isolation structure 104.

Referring to FIG. 13, the first contact region 122 is preferably formed to have a loop shape in the plan view. Moreover, the first contact region 122 can also be formed to not have a loop shape.

Referring to FIG. 14, in the first circuit region 101, a second well region 115 is formed on the surface layer of the first main surface 3. The second well region 115 is an impurity region selectively protruded from a bottom of the first well region 114 toward the second main surface 4. The second well region 115 is formed to cross the first MISFET 102 and the second MISFET 103. An end portion 116 of the second well region 115 departs inward from the second trench isolation structure 104. A portion of the substrate region 158 can also be interposed between the end portion 116 of the second well region 115 and the second trench isolation structure 104.

The semiconductor device 1 further includes a first element isolation structure 106 on the first main surface 3 in the first circuit region 101 to define and form a first MIS region 105. The first element isolation structure 106 can also be referred to as a shallow trench isolation (STI) structure. The first MIS region 105 can also be referred to as "a first active region", or "an n-side active region".

The first element isolation structure 106 is formed have to a loop shape surrounding a partial region of the first main surface 3 in the plan view, and defines and forms the first MIS region 105 in a predetermined shape. In this embodiment, the first element isolation structure 106 is formed to have a polygonal shape with four sides parallel to the periphery (the first to fourth side surfaces 5A to 5D) of the first main surface 3 in the plan view to define and form the first MIS region 105 having a quadrilateral shape. A planar shape of the first element isolation structure 106 can be any as desired, and can also be formed to have a polygonal loop shape. The first MIS region 105 can also be defined and formed to have a polygonal loop shape according to the planar shape of the first element isolation structure 106.

The first element isolation structure 106 includes an isolation trench 107 and a buried insulator 108. The isolation trench 107 is formed on the first main surface 3, and defines and forms a wall surface of the first element isolation structure 106. The buried insulator 108 is buried throughout the entire width direction from the bottom to an opening end of the isolation trench 107. The isolation trench 107 is filled by the buried insulator 108. The buried insulator 108 can include a silicon oxide film formed by an oxide of the chip 2, or can include a silicon oxide film formed by means of CVD.

Referring to FIG. 15, a width WE1 of an element structure of the first MISFET 102 including the width W1 of the first MIS region 105 and the width W2 of the first element isolation structure 106 can be less than 1 μm. In the cross-sectional view shown in FIG. 15, the width WE can be a width obtained by adding the width W2 of the opening ends of the isolation trench 107 of one pair of first element isolation structures 106 and the width W1 of the first MIS region 105 sandwiched by the pair of first element isolation structure 106. For example, the width W1 of the first MIS region 105 can be between 0.15 μm and 0.3 μm, and the width W2 of each isolation trench 107 can be 0.2 μm and 0.4 μm.

A first outer region 109 is formed on an outer side of the first element isolation structure 106. The first outer region 109 is a region sandwiched between the first element isolation structure 106 and a first outer isolation structure 110 surrounding the first element isolation structure 106. In FIG. 14, only the part of the first outer isolation structure 110 forming a border of the first MISFET 102 and the second MISFET 103 is depicted. Similar to the element isolation structure 106, the first outer isolation structure 110 includes the isolation trench 107 and the buried insulator 108.

In the first MIS region 105, a first gate electrode 111 is formed on the first main surface 3. The first gate electrode 111 can include a conductive polycrystalline silicon.

A first gate insulating film 112 is formed between the first gate electrode 111 and the chip 2. The first gate insulating film 112 can include a silicon oxide film. The first gate insulating film 112 preferably includes a silicon oxide film formed by an oxide of the chip 2.

A first sidewall structure 113 is formed at a periphery of the first gate electrode 111. The first sidewall structure 113 is formed continuously globally throughout the periphery of the first gate electrode 111 to cover a side surface of the first gate electrode 111. The first sidewall structure 113 includes at least one of silicon oxide and silicon nitride. In this embodiment, the first sidewall structure 113 includes silicon oxide. The first sidewall structure 113 can also include silicon nitride. That is, the first sidewall structure 113 can also include an insulator different from the first gate insulating film 112.

A pair of n-type first source region 117 and n-type first drain region 118 are formed at an interval on a surface layer of the first well region 114. The first source region 117 and the first drain region 118 have an n-type impurity concentration higher than the p-type impurity concentration of the first well region 114. Referring to FIG. 13, the first source region 117 and the first drain region 118 extend in parallel in the second direction Y. The first source region 117 and the first drain region 118 can be formed to have equal-sized rectangular shapes longer in the second direction in the plan view. Referring to FIG. 14, the first source region 117 and the first drain region 118 are formed in alignment relative to the first gate electrode 111.

In the first MIS region 105, a p-type region between one pair of first source region 117 and first drain region 118 is a first channel region 121. The first gate electrode 111 is separated by the first gate insulating film 112 to face the first channel region 121. The first channel region 121 is formed by a part of the first well region 114.

The semiconductor device 1 includes the interlayer insulating layer 12 covering the first main surface 3 in the first MIS region 105 and the first outer region 109. The semiconductor device 1 includes one or more first drain wirings 123 formed in the interlayer insulating layer 12. The one or more first drain wirings 123 are formed by a wiring layer formed in the interlayer insulating layer 12. The one or more first drain wirings 123 are selectively routed in the interlayer insulating layer 12, and are electrically connected to the first drain region 118 via a first via electrode 126.

The semiconductor device 1 includes one or more first source wirings 124 formed in the interlayer insulating layer 12. The one or more first source wirings 124 are formed by a wiring layer formed in the interlayer insulating layer 12. The one or more first source wirings 124 are selectively routed in the interlayer insulating layer 12, and are electrically connected to the isolation electrode 63, the first source region 117 and the first contact region 122 via the first via electrode 126.

The semiconductor device 1 includes one or more first gate wirings 125 formed in the interlayer insulating layer 12. The one or more first gate wirings 125 are formed by a wiring layer formed in the interlayer insulating layer 12. The one or more first gate wirings 125 are selectively routed in the interlayer insulating layer 12, and are electrically connected to the first gate electrode 111 via the first via electrode 126.

Referring to FIG. 14, an empty region 157 in which the first well region 114 is absent is formed in a part of the first well region 114 in the first circuit region 101. The second well region 115 enters the empty region 157 and is exposed from the first main surface 3.

In the empty region 157, a third well region 144 is formed on a surface layer of the second well region 115. The third well region 114 is formed inward to be away from the first well region 114. A bottom of the third well region 114 is formed in a region on the side of the first main surface 3 relative to a middle portion of the second trench isolation structure 104.

In the empty region 157, a fourth well region 145 is further formed on the surface layer of the second well region 115. The fourth well region 145 is an impurity region selectively protruded from a bottom of the third well region 144 toward the second main surface 4. The fourth well region 145 is formed inward to be away from the first well region 114. The fourth well region 145 has an end portion 146 covering a side portion of the third well region 144. A portion of the second well region 115 can also be interposed between the end portion 146 of the fourth well region 145 and the first well region 114. A bottom of the fourth well region 145 is formed in a region on the side of the first main surface 3 relative to a bottom wall of the second trench isolation structure 104.

The semiconductor device 1 further includes a second element isolation structure 136 on the first main surface 3 in the first circuit region 101 to define and form a second MIS region 135, as an example of a first active region. The second element isolation structure 136 can also be referred to as a shallow trench isolation (STI) structure. The second MIS region 135 can also be referred to as "a second active region", or "a p-side active region".

The second element isolation structure 136 is formed have to a loop shape surrounding a partial region of the first main surface 3 in the plan view, and defines and forms the second MIS region 135 in a predetermined shape. In this embodiment, the second element isolation structure 136 is formed to have a polygonal shape with four sides parallel to the periphery (the first to fourth side surfaces 5A to 5D) of the first main surface 3 in the plan view to define and form the second MIS region 135 having a quadrilateral shape. A planar shape of the second element isolation structure 136 can be any as desired, and can also be formed to have a polygonal loop shape. The second MIS region 135 can also be defined and formed to have a polygonal loop shape according to the planar shape of the second element isolation structure 136.

The second element isolation structure 136 includes an isolation trench 137 and a buried insulator 138. The isolation trench 137 is formed on the first main surface 3, and defines and forms a wall surface of the second element isolation structure 136. The buried insulator 138 is buried throughout the entire width direction from the bottom to an opening end of the isolation trench 137. The isolation trench 137 is filled by the buried insulator 138. The buried insulator 138 can include a silicon oxide film formed by an oxide of the chip 2, or can include a silicon oxide film formed by means of CVD.

Although omitted in the drawings, a width of the second MIS region 135 and a width of the second element isolation structure 136 can be respectively equal to the width W1 and the width W2 in FIG. 15. Thus, a width of the element structure of the second MISFET 103 can be equal to the width WE1 (for example, less than 1 μm) of the element structure of the first MISFET 102 shown in FIG. 15.

A second outer region 139 is formed on an outer side of the second element isolation structure 136. The second outer region 139 is a region sandwiched between the second element isolation structure 136 and a second outer isolation structure 140 surrounding the second element isolation structure 136. In FIG. 14, only the part of the second outer isolation structure 140 forming a border of the first MISFET 102 and the second MISFET 103 is depicted. The second outer isolation structure 140 is integrally formed with the first outer isolation structure 110 between the first outer region 109 and the second outer region 139.

In the second MIS region 135, a second gate electrode 141 is formed on the first main surface 3. The second gate electrode 141 can include a conductive polycrystalline silicon.

A second gate insulating film 142 is formed between the second gate electrode 141 and the chip 2. The second gate insulating film 142 can include a silicon oxide film. The second gate insulating film 142 preferably includes a silicon oxide film formed by an oxide of the chip 2.

A second sidewall structure 143 is formed at a periphery of the second gate electrode 141. The second sidewall structure 143 is formed continuously globally throughout the periphery of the second gate electrode 141 to cover a side surface of the second gate electrode 141. The second sidewall structure 143 includes at least one of silicon oxide and silicon nitride. In this embodiment, the second sidewall structure 143 includes silicon oxide. The second sidewall structure 143 can also include silicon nitride. That is, the second sidewall structure 143 can also include an insulator different from the second gate insulating film 142.

A pair of n-type second source region 147 and n-type first drain region 148 are formed at an interval on a surface layer of the third well region 144. The second source region 147 and the second drain region 148 have an n-type impurity concentration higher than the p-type impurity concentration of the third well region 144. Referring to FIG. 13, the second source region 147 and the second drain region 148 extend in parallel in the second direction Y. The second source region 147 and the second drain region 148 can be formed to have equal-sized rectangular shapes longer in the second direction in the plan view. Referring to FIG. 14, the second source region 147 and the second drain region 148 are formed in alignment relative to the second gate electrode 141.

In the second MIS region 135, an n-type region between one pair of second source region 147 and second drain region 148 is a second channel region 151. The second gate electrode 141 is separated by the second gate insulating film 142 to face the second channel region 151. The second channel region 151 is formed by a part of the third well region 144.

In the second outer region 139, a second contact region 152 is formed on the surface layer of the third well region 144. The second contact region 152 can also be referred to as "a back gate region". The second contact region 152 has an n-type impurity concentration higher than the n-type impurity concentration of the third well region 144. The second contact region 152 is formed at an interval from the second trench isolation structure 104. The second contact region 152 can also be formed to be in contact with the second trench isolation structure 104.

The semiconductor device 1 includes the interlayer insulating layer 12 covering the first main surface 3 in the second MIS region 135 and the second outer region 139. The semiconductor device 1 includes one or more second drain wirings 153 formed in the interlayer insulating layer 12. The one or more second drain wirings 153 are formed by a wiring layer formed in the interlayer insulating layer 12. The one or more second drain wirings 153 are selectively routed in the interlayer insulating layer 12, and are electrically connected to the second drain region 148 via a second via electrode 156. Referring to FIG. 13, the second drain wiring 153 and the first drain wiring 123 are a common wiring, and accordingly the first drain region 118 and the second drain region 148 are electrically connected to each other.

The semiconductor device 1 includes one or more second source wirings 154 formed in the interlayer insulating layer 12. The one or more second source wirings 154 are formed by a wiring layer formed in the interlayer insulating layer 12. The one or more second source wirings 154 are selectively routed in the interlayer insulating layer 12, and are electrically connected to the second source region 147 and the second contact region 152 via the second via electrode 156.

The semiconductor device 1 includes one or more second gate wirings 155 formed in the interlayer insulating layer 12. The one or more second gate wirings 155 are formed by a wiring layer formed in the interlayer insulating layer 12. The one or more second gate wirings 155 are selectively routed in the interlayer insulating layer 12, and are electrically connected to the second gate electrode 141 via the second via electrode 156. Referring to FIG. 13, the second gate wiring 155 and the first gate wiring 125 are a common wiring, and accordingly the first gate electrode 111 and the second gate electrode 141 are electrically connected to each other.

[Element Having LOCOS Structure]

Figure 16:
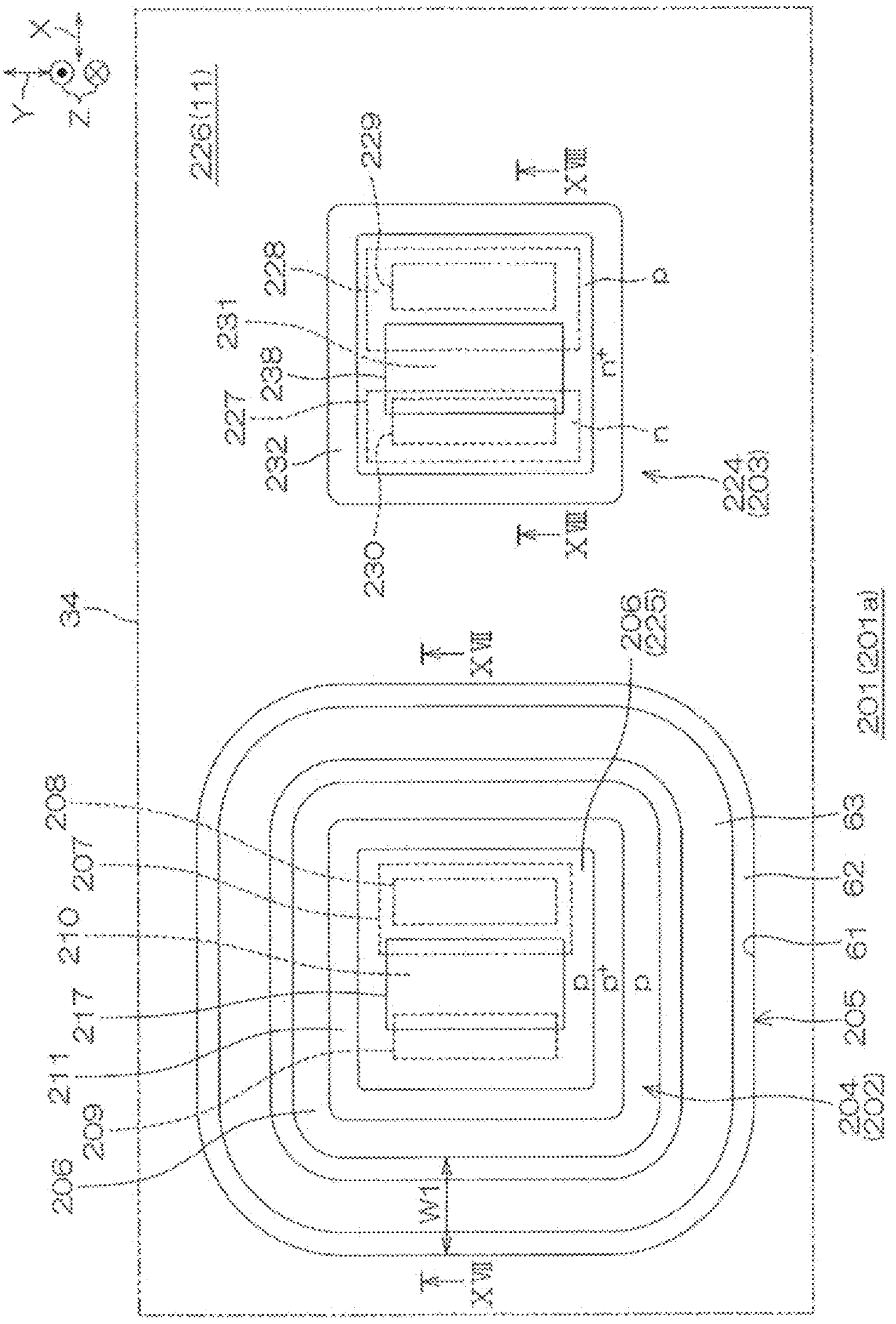
FIG. 16 is an enlarged plan view of the logic circuit region shown in FIG. 1.
Figure 17:
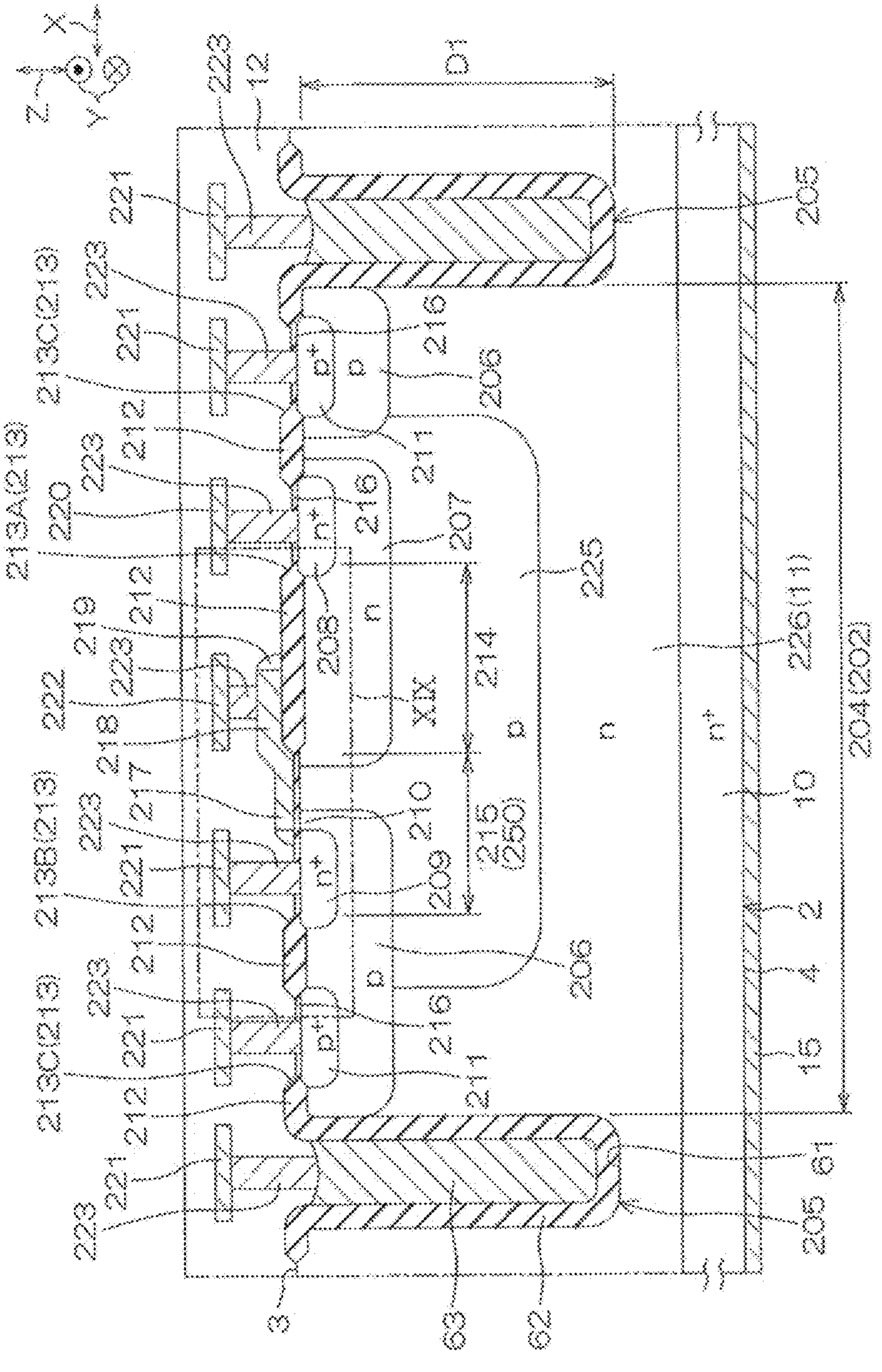
FIG. 17 is a cross-sectional view along a section line XVII-XVII in FIG. 16.
Figure 18:
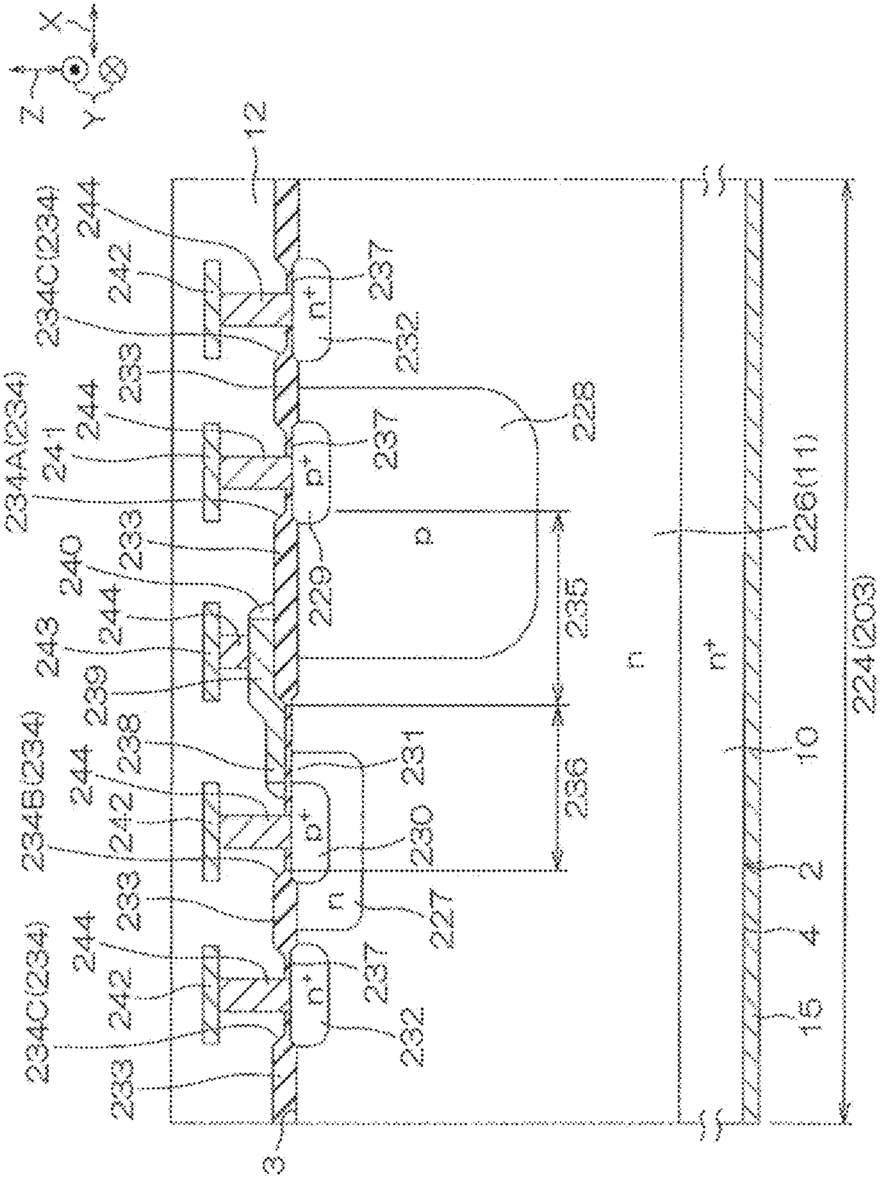
FIG. 18 is a cross-sectional view along a section line XVIII-XVIII in FIG. 16.
Figure 19:
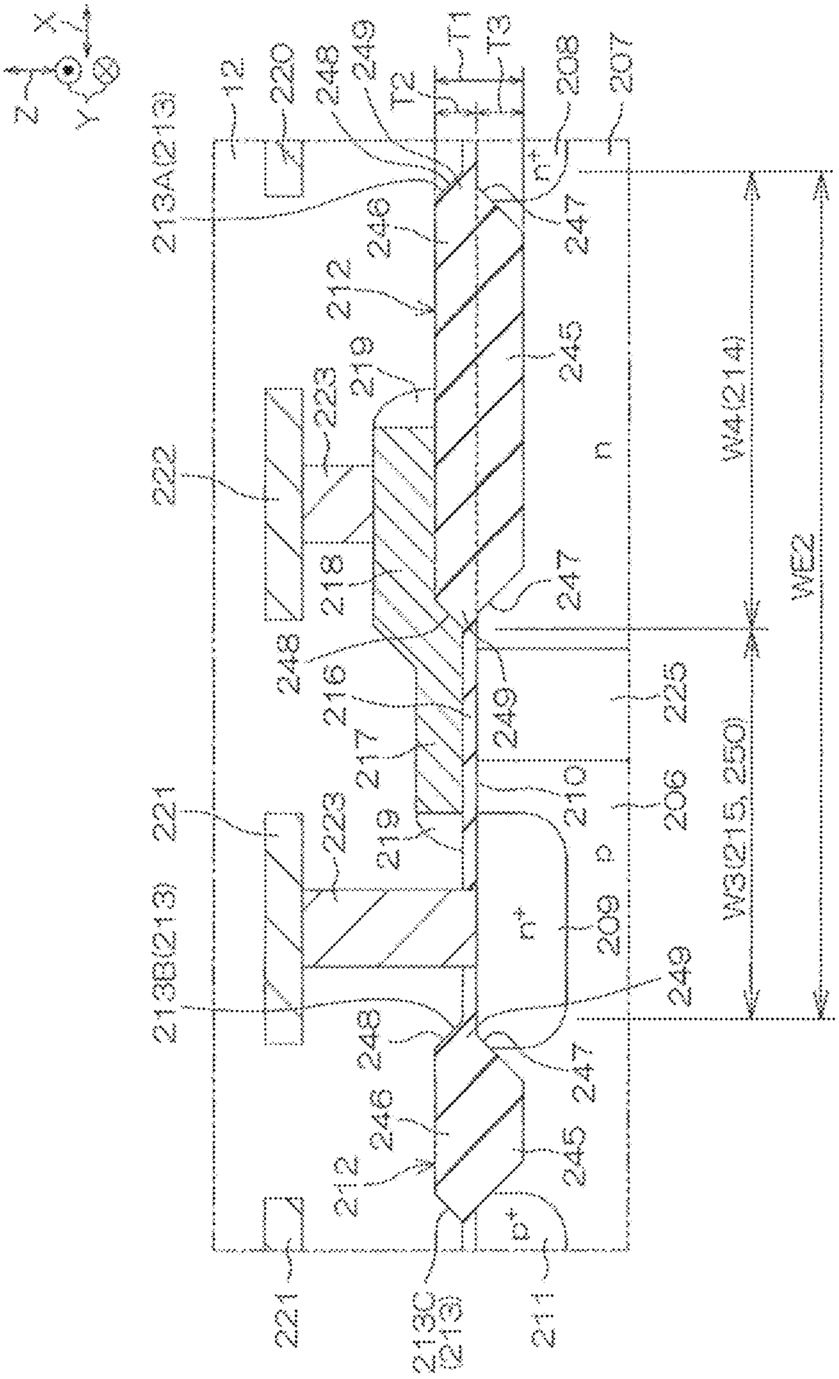
FIG. 19 is an enlarged diagram of a region XIX shown in FIG. 17.

With reference to FIG. 16 to FIG. 19, the configuration of a second circuit region 201 in which the amplifier circuit 34 is formed on the side of the control region 7 is described below. FIG. 16 shows a plan view of the second circuit region 201 in which the amplifier circuit 34 shown in FIG. 1 is formed. FIG. 17 shows a cross-sectional view along a section line XVII-XVII in FIG. 16. FIG. 18 shows a cross-sectional view along a section line XVIII-XVIII in FIG. 16. FIG. 19 shows an enlarged diagram of a region XIX in FIG. 17. The second circuit region 201 can also be referred to as an amplifier circuit region.

Referring to FIG. 16 to FIG. 19, the semiconductor device 1 includes the second circuit region 201 defined and formed on the first main surface 3 in the output region 7. The second circuit region 201 is a region applied with a voltage (a potential) different from that of the output region 6 and is a region in which a circuit of multiple electronic circuits (electronic devices) is formed, wherein the circuit is, for example, a CMIS 201*a* as a second CMIS transistor.

More specifically, the CMIS 101*a* includes an n-type first MISFET 202 (a second n-type MIS transistor) and a p-type second MISFET 203 (a second p-type MIS transistor) that are complementarily connected. The first MISFET 202 is driven and controlled by a voltage application condition different from that of the output transistor 20. The second MISFET 203 is driven and controlled by a voltage application condition different from those of the output transistor 20 and the first MISFET 202. Moreover, the n-type first MISFET 202 and the p-type second MISFET 203 can be combined in complementary as this embodiment, or can be formed as independent elements from each other.

A rated voltage (a second rated voltage) of the first MISFET 202 and the second MISFET 203 can be, for example, higher than the rate voltage of the first MISFET 102 and the second MISFET 103. The rated voltage of the first MISFET 202 and the second MISFET 203 can be, for example, between 30 V and 50 V.

The rated voltage of the first MISFET 202 and the second MISFET 203 can be defined to be within a range of a maximum tolerance of a voltage applied between the source and the drain of the first MISFET 202 and the second MISFET 203. The rated voltage of the first MISFET 202 and the second MISFET 203 can also be referred to a withstand voltage of the first MISFET 202 and the second MISFET 203.

The specific structure in the second circuit region 201 is described below.

Referring to FIG. 16 and FIG. 17, the semiconductor device 1 includes a third trench isolation structure 205 formed on the first main surface 3 in the second circuit region 201 to define and form a first MIS region 204. The first MIS region 204 is a device region controlled by a voltage application condition different from that of the output region 6. The third trench isolation structure 205 can also be referred to as a deep trench isolation (DTI) structure.

The third trench isolation structure 205 is formed to have a loop shape surrounding a partial region of the first main surface 3 in the plan view, and defines and forms the first MIS region 204 in a predetermined shape. In this embodiment, the third trench isolation structure 205 is formed to have a polygonal shape with four sides parallel to the periphery (the first to fourth side surfaces 5A to 5D) of the first main surface 3 in the plan view to define and form the first MIS region 204 having a quadrilateral shape. A planar shape of the third trench isolation structure 205 can be any as desired, and can also be formed to have a polygonal loop shape. The first MIS region 204 can also be defined and formed to have a polygonal loop shape according to the planar shape of the third trench isolation structure 205.

Similar to the first trench isolation structure 60, the third trench isolation structure 205 has the isolation width W1 and the isolation depth D1 (that is, the aspect ratio D1/W1). A bottom wall of the third trench isolation structure 205 is preferably formed at an interval of between 1 μm and 5 μm relative to a bottom of a substrate region 226. The substrate region 226 is integrally connected to the drift region 11, and is formed by an n-type epitaxial layer (a Si epitaxial layer).

The third trench isolation structure 205 has a corner connecting a portion extending in the first direction X and a portion extending in the second direction Y into an arc shape. In this embodiment, four corners of the third trench isolation structure 205 have an arc shape. That is, the first MIS region 204 is defined and formed to have a quadrilateral shape having four corners respectively extending in an arc shape. The corners of the third trench isolation structure 205 preferably have a fixed isolation width W1 along an arc direction.

Similar to the first trench isolation structure 60, the third trench isolation structure 205 has a single electrode structure including the isolation trench 61, the isolation insulating film 62 and the isolation electrode 63. "The isolation trench 61", "the isolation insulating film 62" and "the isolation electrode 63" of the third trench isolation structure 205 can also be referred to as "a third isolation trench", "a third isolation insulating film" and "a third isolation electrode". The description associated with the isolation trench 61, the isolation insulating film 62 and the isolation electrode 63 of the third trench isolation structure 205 are applicable to the isolation trench 61, the isolation insulating film 62 and the isolation electrode 63 of the first trench isolation structure 60, and are omitted herein.

The semiconductor device 1 includes a first well region 206 formed on the surface layer of the first main surface 3 in the first MIS region 204. The first well region 206 is formed on the surface layer of the first main surface 3 in the first MIS region 204, and is in contact with the third trench isolation structure 205. A bottom of the first well region 206 is formed in a region on the side of the first main surface 3 relative to a bottom wall of the third trench isolation structure 205. A bottom of the first well region 206 is formed in a region on the side of the bottom wall of the third trench isolation structure 205 relative to a middle portion of the third trench isolation structure 205. That is, the bottom of the first well region 206 is formed in a region on the side of the bottom wall of the third trench isolation structure 205 relative to a depth position of the bottom of the main region 67.

In the first MIS region 204, a second well region 225 is formed on the surface layer of the first main surface 3. The second well region 225 is an impurity region selectively protruded from a bottom of the first well region 206 toward the second main surface 4.

The semiconductor device 1 includes an n-type third well region 207 formed on a surface layer of the second well region 225. The third well region 207 is formed at an interval from the third trench isolation structure 205 on a surface layer of the second well region 225. The third well region 207 can be formed as a strip extending in a direction (the second direction Y) in the plan view. The third well region 207 is formed at an interval from a bottom of the second well region 225 toward the side of the first main surface 3. The third well region 207 is separated by a part of the first well region 206 to face the substrate region 226.

The semiconductor device 1 includes an n-type first drain region 208 formed on a surface layer of the third well region 207. The first drain region 208 has an n-type impurity concentration higher than an n-type impurity concentration of the third well region 207. The first well region 208 is formed at an interval from a periphery of the third well region 207 on the surface layer of the third well region 207. The first drain region 208 can be formed as a strip extending in a direction (the second direction Y) in the plan view. The first drain region 208 is formed at an interval from a bottom of the third well region 207 toward the side of the first main surface 1. The first drain region 208 is separated by a part of the third well region 207 to face the second well region 225.

The semiconductor device 1 includes an n-type first source region 209 formed at an interval from the third well region 207 on the surface layer of the first well region 206. The first source region 209 has an n-type impurity concentration substantially equal to an n-type impurity concentration of the first drain region 208. The first source region 209 is formed at an interval from the third trench isolation structure 205. The first source region 209 can be formed as a strip extending in a direction (the second direction Y) in the plan view. The first source region 209 is formed at an interval from a depth position of a bottom of the first well region 206 toward the side of the first main surface 1.

The semiconductor device 1 includes a first channel region formed in a region between the third well region 207 and the first source region 209 on the surface layers of the first well region 206 and the second well region 225. The first channel region 210 forms a channel of the first MISFET 202.

The semiconductor device 1 includes a p-type first contact region 211 formed on the surface layer of the first well region 206. The first contact region 211 has a p-type impurity concentration higher than a p-type impurity concentration of the first well region 206. The first contact region 211 is formed at an interval from the third trench isolation structure 205. The first contact region 211 can be formed as a strip extending along the third trench isolation structure 205 in the plan view. The first contact region 211 is preferably formed to have a loop shape surrounding the third well region 207 and the first source region 209. The first contact region 211 can also be in contact with the third trench isolation structure 205.

The semiconductor device 1 includes a first field insulating film 212 partially covering the first main surface 3 in the first MIS region 204. In this embodiment, the first field insulating film 212 includes silicon oxide. More specifically, the first field insulating film 212 is formed by means of local oxidation of silicon (LOCOS), and includes a silicon oxide film formed by an oxide of the semiconductor chip 2.

The first field insulating film 212 covers the third well region 207. The first field insulating film 212 covers a region between the first drain region 208 and the first contact region 211. The first field insulating film 212 covers a region between the first source region 209 and the first contact region 211. The first field insulating film 212 covers a region between the third trench isolation structure 205 and the first contact region 211. The field insulating film 212 is connected to the isolation insulating film 62 exposed from an inner peripheral wall of the third trench isolation structure 205 at a peripheral portion of the first MIS region 204.

The field insulating film 212 includes multiple first openings 213 exposing the first main surface 3. The multiple first openings 213 include at least one first drain opening 213A, at least one first channel opening 213B, and at least one first contact opening 213C.

The first drain opening 213A exposes the first drain region 208. The number of the first drain opening 213A can be any as desired. One first drain opening 213A can be formed, or multiple first drain openings 213A can be formed. The first channel opening 213B exposes the first source region 209 and the first channel region 210. The first channel opening 213B can also expose the third well region 207. The number of the first channel opening 213B can be any as desired. One first channel opening 213A can be formed, or multiple first channel openings 213A can be formed.

The first contact opening 213C exposes the first contact region 211. The number of the first contact opening 213C can be any as desired. One first contact opening 213A can be formed, or multiple first contact openings 213A can be formed. In this case, the multiple first contact openings 213C are formed at intervals along the first contact region 211.

Each of the multiple first openings 213 can be formed to have a quadrilateral shape in the plan view. That is, each of the multiple first openings 213 can have a side extending in a direction (the first direction X) and a side extending in a crossing direction (the second direction Y) intersecting the direction.

The semiconductor device 1 includes a first hidden surface 214 and a first exposed surface 215 formed on the first main surface 3 in the first MIS region 204. The first hidden surface 214 forms a portion covered by the first field insulating film 212 on the first main surface 3. The first exposed surface 215 forms a portion exposed from the first field insulating film 212 on the first main surface 3. In other words, the first main surface 3 includes the first hidden surface 214 and the first exposed surface 215 formed by dividing the first MIS region 204 by the first field insulating film 212. The first exposed surface 215 can also be an active region 250 in the first MIS region 204.

In this embodiment, the first hidden surface 214 is recessed in the thickness direction (toward the side of the second main surface 4) of the semiconductor chip 2 relative to the first exposed surface 215. In this embodiment, starting from a periphery of each of the first openings 213 of the first field insulating film 212, the first hidden surface 214 is further recessed in the thickness direction (toward the side of the second main surface 4) of the semiconductor chip 2 relative to the first exposed surface 215.

Referring to FIG. 19, a width WE2 of an element structure of the first MISFET 202 including a width W3 of the first exposed surface 215 (the active region 250) and a width W4 of the first hidden surface 214 (the first field insulating film 212) can be less than 1 μm. For example, the width W3 of the first exposed surface 215 can be between 3 μm and 7 μm, and the width W4 of the hidden surface 214 can be between 2 μm and 6 μm.

Referring to FIG. 19, the first field insulating film 212 integrally includes a buried portion 245 buried in the chip 2 with respect to the first main surface 3, and a protruding portion 246 protruded toward an opposite side of the buried portion 245 with respect to the first main surface 3. The buried portion 245 and the protruding portion 246 respectively have inclined surfaces 247 and 248 respectively inclining upward and inclining downward near a periphery of each of the first openings 213. The inclined surface 247 is perpendicular to the inclined surface 248 at the first main surface 3, and accordingly a beak portion 249 is formed at the periphery of each of the first openings 213.

A thickness of the first field insulating film 212 can be, for example, between 500 Å and 3000 Å. In this embodiment, thicknesses of the buried portion 245 and the protruding portion 246 of the first field insulating film 212 are different from each other. A thickness T2 of the protruding portion 246 can be greater than a thickness T3 of the buried portion 245. The reason for the thickness T2 being equal to or less than the thickness T3 is because, for example, after the first field insulating film 212 is formed by means of LOCOS, the first field insulating film 212 is etched and cut. Moreover, depending on manufacturing conditions, there are cases where the protruding portion 246 is not formed.

The semiconductor device 1 includes a main surface insulating film 216 selectively covering the first main surface 3 in the MIS region 204. In this embodiment, the first main surface insulating film 216 includes silicon oxide. The first main surface insulating film 216 covers a portion exposed from the multiple first openings 213 on the first main surface 3. That is, the first main surface insulating film 216 at least covers the first drain region 208, the first source region 209, the first channel region 210 and the first contact region 211. The first main surface insulating film 216 covers the first exposed surface 215, and is connected to the first field insulating film 212. The first main surface insulating film 216 is thinner than the first field insulating film 212.

The semiconductor device 1 includes a first gate electrode 217 separated by the first main surface insulating film 216 to face the first channel region 210 in the first channel opening 213B. In this embodiment, the first gate electrode 217 includes a conductive polycrystalline silicon. A gate potential is applied to the first gate electrode 217. The first gate electrode 217 controls on and off of the first channel region 210. More specifically, the first gate electrode 217 faces the third well region 207, the first source region 209 and the first channel region 210 in the plan view.

The first gate electrode 217 is formed as a strip extending along the first channel region 210 in the plan view. The first gate electrode 217 has a first drawn-out portion 218 drawn out from over the first main surface insulating film 216 to over the first field insulating film 212 on the side of the first drain region 208. The first drawn-out portion 218 is formed at an interval from the first drain region 208 toward the side of the first source region 209, and is separated by the first field insulating film 212 to face the third well region 207. The first drawn-out portion 218 can also be referred to as a field board alleviating an electric field between the source and the drain.

The first field insulating film 212 (the LOCOS structure) can also include a withstand voltage maintaining insulating film supporting a field board. The field board is not limited to being the first drawn-out portion 218 of the first gate electrode 217, but can also be an electrically and physically separate field board from the first gate electrode 217. Moreover, the field board can be electrically floating or can be fixed at a source potential.

The semiconductor device 1 includes a first sidewall structure 219 covering a sidewall of the first gate electrode 217. The first sidewall structure 219 is located on the first field insulating film 212 and the first main surface insulating film 216. The first sidewall structure 219 includes at least one of silicon oxide and silicon nitride. In this embodiment, the first sidewall structure 219 includes silicon oxide. The first sidewall structure 219 can also include silicon nitride. That is, the first sidewall structure 219 can also include an insulator different from the first field insulating film 212 and the first main surface insulating film 216.

The semiconductor device 1 includes the interlayer insulating layer 12 covering the first main surface 3 in the first MIS region 204. The semiconductor device 1 includes one or more first drain wirings 220 formed in the interlayer insulating layer 12. The one or more first drain wirings 220 are formed by a wiring layer formed in the interlayer insulating layer 12. The one or more first drain wirings 220 are selectively routed in the interlayer insulating layer 12, and are electrically connected to the first drain region 208 via a first via electrode 223.

The semiconductor device 1 includes one or more first source wirings 221 formed in the interlayer insulating layer 12. The one or more first source wirings 221 are formed by a wiring layer formed in the interlayer insulating layer 12. The one or more first source wirings 221 are selectively routed in the interlayer insulating layer 12, and are electrically connected to the isolation electrode 63, the first source region 209 and the first contact region 211 via the first via electrode 223.

The semiconductor device 1 includes one or more first gate wirings 222 formed in the interlayer insulating layer 12. The one or more first gate wirings 222 are formed by a wiring layer formed in the interlayer insulating layer 12. The one or more first gate wirings 222 are selectively routed in the interlayer insulating layer 12, and are electrically connected to the first gate electrode 217 via the first via electrode 223.

Referring to FIG. 16 and FIG. 18, the semiconductor device 1 includes a second MIS region 224 on the first main surface 3 in the second circuit region 201.

The semiconductor device 1 includes an n-type fourth well region 227 formed on a surface layer of the substrate region 226 in the second MIS region 224. The fourth well region 227 can be formed as a strip extending in a direction (the second direction Y) in the plan view.

The semiconductor device 1 includes a p-type fifth well region 228 formed on the surface layer of the substrate region 226 in the second MIS region 224. The fifth well region 228 is formed at an interval from a periphery of the fourth well region 227 on the surface layer of the substrate region 226. The fifth well region 228 can be formed as a strip extending in a direction (the second direction Y) in the plan view.

The semiconductor device 1 includes a p-type second drain region 229 formed on a surface layer of the fifth well region 228. The second drain region 229 has a p-type impurity concentration higher than a p-type impurity concentration of the fifth well region 228. The second drain region 229 is formed at an interval from a periphery of the fifth well region 228 on the surface layer of the fifth well region 228. The second drain region 229 can be formed as a strip extending in a direction (the second direction Y) in the plan view. The second drain region 229 is formed at an interval from a bottom of the fifth well region 228 toward the side of the first main surface 3.

The semiconductor device 1 includes a p-type source region 230 formed at an interval from the fifth well region 228 on a surface layer of the fourth well region 227. The second source region 230 has a p-type impurity concentration substantially equal to a p-type impurity concentration of the second drain region 229. The second source region 230 can be formed as a strip extending in a direction (the second direction Y) in the plan view.

The semiconductor device 1 includes a second channel region 231 formed in the substrate region 226 and the fourth well region 227 in the second MIS region 224. The second channel region 231 forms a channel of the second MISFET 203.

The semiconductor device 1 includes an n-type second contact region 232 formed on a surface layer of the substrate region 226 in the second MIS region 224. The second contact region 232 has an n-type impurity concentration higher than an n-type impurity concentration of the substrate region 226. The second contact region 232 is preferably formed to have a loop shape surrounding the fourth well region 227 and the fifth well region 228.

The semiconductor device 1 includes a second field insulating film 233 partially covering the first main surface 3 in the second MIS region 224. In this embodiment, the second field insulating film 233 includes silicon oxide. More specifically, the second field insulating film 233 preferably includes a silicon oxide film formed by an oxide of the semiconductor chip 2.

The second field insulating film 233 covers the fourth well region 227 and the fifth well region 228. The second field insulating film 233 covers a region between the second drain region 229 and the second contact region 232. The second field insulating film 233 covers a region between the second source region 230 and the second contact region 232.

The field insulating film 233 includes multiple second openings 234 exposing the first main surface 3. The multiple second openings 234 include at least one second drain opening 234A, at least one second channel opening 234B, and at least one second contact opening 234C.

The second drain opening 234A exposes the second drain region 229. The number of the second drain opening 234A can be any as desired. One second drain opening 234A can be formed, or multiple second drain openings 234A can be formed. The second channel opening 234B exposes the second source region 230 and the second channel region 231. The number of the second channel opening 234B can be any as desired. One second channel opening 234B can be formed, or multiple second channel openings 234B can be formed.

The second contact opening 234C exposes the second contact region 232. The number of the second contact opening 234C can be any as desired. One second contact opening 234C can be formed, or multiple second contact openings 234C can be formed. In this case, the multiple second contact openings 234C are formed at intervals along the second contact region 232.

Each of the multiple second openings 234 can be formed to have a quadrilateral shape in the plan view. That is, each of the multiple second openings 234 can have a side extending in a direction (the first direction X) and a side extending in a crossing direction (the second direction Y) intersecting the direction.

The semiconductor device 1 includes a second hidden surface 235 and a second exposed surface 236 formed on the first main surface 3 in the second MIS region 224. The second hidden surface 235 forms a portion covered by the second field insulating film 233 on the first main surface 3. The second exposed surface 236 forms a portion exposed from the second field insulating film 233 on the first main surface 3. In other words, the first main surface 3 includes the second hidden surface 235 and the second exposed surface 236 formed by dividing the second MIS region 224 by the second field insulating film 233.

In this embodiment, the second hidden surface 235 is recessed in the thickness direction (toward the side of the second main surface 4) of the semiconductor chip 2 relative to the second exposed surface 236. In this embodiment, starting from a periphery of each of the second openings 234 of the second field insulating film 233, the second hidden surface 235 is further recessed in the thickness direction (toward the side of the second main surface 4) of the semiconductor chip 2 relative to the second exposed surface 236.

Although omitted in the drawings, a width of the exposed surface and a width of the second hidden surface 235 can be respectively equal to the width W3 and the width W4 in FIG. 19. Thus, a width of an element structure of the second MISFET 203 can be equal to the width WE2 (for example, less than 2 μm) of the element structure of the first MISFET 102 shown in FIG. 19. Moreover, similar to the first field insulating film 212 in FIG. 19, the second field insulating film 233 has the buried portion 245 and the protruding portion 246, and the respective thicknesses T2 and T3 are also the same.

The semiconductor device 1 includes a second main surface insulating film 237 selectively covering the first main surface 3 in the second MIS region 224. In this embodiment, the second main surface insulating film 237 includes silicon oxide. The second main surface insulating film 237 covers a region outside the second field insulating film 233 on the first main surface 3. The second main surface insulating film 237 covers the second exposed surface 236, and is connected to the second field insulating film 233. The second main surface insulating film 237 is thinner than the second field insulating film 233.

The semiconductor device 1 includes a second gate electrode 238 (a main surface electrode) separated by the second main surface insulating film 237 to face the second channel region 231 in the second channel opening 234B. In this embodiment, the second gate electrode 238 includes a conductive polycrystalline silicon. A gate potential is applied to the second gate electrode 238. The second gate electrode 238 controls on and off of the second channel region 231. More specifically, the second gate electrode 238 faces the fourth well region 227, the fifth well region 228, the second source region 230 and the second channel region 231 in the plan view.

The second gate electrode 238 is formed as a strip extending along the second channel region 231 in the plan view. The second gate electrode 238 has a second drawn-out portion 239 drawn out from over the second main surface insulating film 237 to over the second field insulating film 233 on the side of the second drain region 229. The second drawn-out portion 239 is formed at an interval from the second drain region 229 toward the side of the second source region 230, and is separated by the second field insulating film 233 to face the fifth well region 228. The second drawn-out portion 239 can also be referred to as a field board alleviating an electric field between the source and the drain.

The second field insulating film 233 (the LOCOS structure) can also include a withstand voltage maintaining insulating film supporting a field board. The field board is not limited to being the second drawn-out portion 239 of the second gate electrode 238, but can also be an electrically and physically separate field board from the second gate electrode 238. Moreover, the field board can be electrically floating or can be fixed at a source potential.

The semiconductor device 1 includes a second sidewall structure 240 covering a sidewall of the second gate electrode 238. The second sidewall structure 240 is located on the second field insulating film 233 and the second main surface insulating film 237. The second sidewall structure 240 includes at least one of silicon oxide and silicon nitride. In this embodiment, the second sidewall structure 240 includes silicon oxide. The second sidewall structure 240 can also include silicon nitride. That is, the second sidewall structure 240 can also include an insulator different from the second field insulating film 233 and the second main surface insulating film 237.

The semiconductor device 1 includes the interlayer insulating layer 12 covering the first main surface 3 in the second MIS region 224. The semiconductor device 1 includes one or more second drain wirings 241 formed in the interlayer insulating layer 12. The one or more second drain wirings 241 are formed by a wiring layer formed in the interlayer insulating layer 12. The one or more second drain wirings 241 are selectively routed in the interlayer insulating layer 12, and are electrically connected to the second drain region 229 via a second via electrode 244.

The semiconductor device 1 includes one or more second source wirings 242 formed in the interlayer insulating layer 12. The one or more second source wirings 242 are formed by a wiring layer formed in the interlayer insulating layer 12. The one or more second source wirings 242 are selectively routed in the interlayer insulating layer 12, and are electrically connected to the isolation electrode 63, the second source region 230 and the second contact region 232 via the second via electrode 244.

The semiconductor device 1 includes one or more second gate wirings 243 formed in the interlayer insulating layer 12. The one or more second gate wirings 243 are formed by a wiring layer formed in the interlayer insulating layer 12. The one or more second gate wirings 243 are selectively routed in the interlayer insulating layer 12, and are electrically connected to the second gate electrode 238 via the second via electrode 244.

As described above, according to the semiconductor device 1, the common chip 2 is hybrid mounted with: the output transistor 20, including the first trench isolation structure 60 in a DTI structure; the CMIS 101*a*, including the first element isolation structure 106 and the second element isolation structure 136 in an STI structure; and the CMIS 201*a*, including the first field insulating film 212 and the second field insulating film 233 in a LOCOS structure. Accordingly, each of the output transistor 20, the CMIS 101*a* and the CMIS 201*a* is capable of achieving desired characteristics.

For example, the output transistor 20 can be better used as an output power transistor that is required to have a high active clamp tolerance and a low on-resistance. For example, for the trench gate structure 70, a narrow pitch of between 1.0 μm and 1.5 μm can be achieved, hence achieving a lower on-resistance.

For example, the CMIS 101*a* is a microstructure in which each of the first MISFET 202 and the second MISFET 203 has the width WE1 less than 1 μm, and so the logic circuit 32 can be better used. Since one CMIS 101*a* is a microstructure, an increase in an area occupied by the logic circuit 32 in the chip 2 can be suppressed even if the logic circuit 32 is largely increased in size. As a result, even for a small area, the logic circuit 32 having outstanding processing capabilities can be implemented.

For example, in contribution to the withstand voltage maintaining function of the first field insulating film 212 and the second field insulating film 233, the CMIS 201*a* can be better used in analog circuits that handle higher voltages. For example, the CMIS 201*a* can be better used as an element structure such as an amplifier circuit or a power circuit in which analog characteristics are more important.

The embodiment the present disclosure is as described above; however, the present disclosure may also be implemented in form of other embodiments.

For example, the output transistor 20 of a dual system is illustrated in the embodiment. However, an output transistor 20 of three systems or more can also be adopted. In this case, multiple block regions 81 for system transistors of systems for configuring three or more systems need to be provided, and at the same the gate wirings 96 for three or more systems corresponding to the block regions 81 need to be provided.

A configuration having the current monitoring circuit 25 is described in the embodiment. The current monitoring circuit 25 can also be formed by at least one unit transistor 22 among the multiple unit transistors 22.

An example where the upper electrode 73 and the lower electrode 74 are of the same potential is shown in the embodiment. However, a source potential can also be applied to the lower electrode 74. In this case, the source wiring 98 is electrically connected to the connection electrode 93 by the via electrode 97.

An example in which the source terminal 13 is formed by an output terminal and the drain terminal 15 is formed by a power terminal is described in the embodiment. However, a configuration where the source terminal 13 is formed by a ground terminal and the drain terminal 15 is formed by an output terminal can also be adopted. In this case, the semiconductor device 1 becomes a low-side switch device electrically interposed between a load (the inductive load L) and the ground.

In this embodiment, the first conductivity type is n type and the second conductivity type is p type. However, the first conductivity type can also be p type and the second conductivity type can also be n type. In this case, a specific configuration can be arrived at by substituting a p-type region for an n-type region and at the same time substituting an n-type region for a p-type region in the description and the accompanying drawings.

The embodiments of the present disclosure described above are examples in all aspects rather than to be understood in a restrictive manner, and are intended to encompass modifications in all aspects.

The features given in the notes below can be extracted from the detailed description and the drawings of the present disclosure. In the description below, alphabets and numerals given in the parentheses represent the corresponding constituents in the embodiments, and are intended to limit the clauses to the implementation details of the embodiments. The term "semiconductor device" given in the clauses below can be replaced by "semiconductor switch device", "semiconductor control device", "semiconductor control device", "electronic circuit", "semiconductor circuit", "intelligent power device", "intelligent power module" or "intelligent power switch".

[Note 1-1]

A semiconductor device (1), comprising:

a semiconductor chip (2), having an element main surface (3);

a first element (2), disposed on the element main surface (3) and including a DTI structure (70) as a part of an element structure;

a second element (101*a*), disposed on the element main surface (3) and separated from the first element (20), wherein the second element includes an STI structure (106, 136); and a third element (201*a*), disposed on the element main surface (3) and separated from the first element (20) and the second element (101*a*), wherein the third element (201*a*) includes a LOCOS structure.

According to the configuration above, the common semiconductor chip (2) is hybrid mounted with the first element (3) including the DTI structure (70), the second element (101*a*) including the STI structure (106, 136), and the third element (201*a*) including the LOCO structure (212, 233). Accordingly, each of the multiple first to third elements (20, 101*a*, 201*a*) can implement desired characteristics.

[Note 1-2]

The semiconductor device (1) according to note 1-1, wherein the DTI structure (70) includes a trench gate structure (70).

[Note 1-3]

The semiconductor device (1) according to note 1-2, wherein the trench gate structure (70) includes a multi-electrodes structure with an upper electrode (73) and a lower electrode (74) buried in a gate trench (71) by a manner of vertical insulation and separation by an insulator (72, 75).

[Note 1-4]

The semiconductor device (1) according to note 1-2 or note 1-3, a plurality of the trench gate structures (70) are formed at intervals on the element main surface (3) of the semiconductor chip (2), and a pitch (P1) of the plurality of trench gate structures (70) is between 1.0 μm and 2.0 μm.

[Note 1-5]

The semiconductor device (1) according to any one of note 1-2 to note 1-4, wherein a width (W2) of each of the trench gate structures (70) is between 0.4 μm and 2 μm.

[Note 1-6]

The semiconductor device (1) according to any one of note 1-1 to note 1-5, wherein the STI structure (106, 136) includes an element isolation structure (106, 136) defining a first active region (105, 135) for forming an element structure of the second element (101*a*), and a width (WE) of the second element (101*a*), including a width (W1) of the first active region (105, 135) and a width (W2) of the element isolation structure (106, 136), is less than 1 μm.

[Note 1-7]

The semiconductor device (1) according to note 1-6, wherein in a cross-sectional view along a first direction, the first active region (105, 135) is sandwiched between a pair of element isolation structures (106, 136) from both sides in the first direction, and the width (WE) of the second element (101*a*) is a sum of a width (W2) of opening ends of trenches of the pair of element isolation structures ((106, 136) and a width (W1) of the first active region (105, 135) on the element main surface (3).

[Note 1-8]

The semiconductor device (1) according to any one of note 1-1 to note 1-7, wherein the third element (201*a*) includes:

a gate electrode (217, 238), formed over the element main surface (3) across a gate insulating film (216, 237); and a field insulating film (212, 233), as the LOCOS structure (216, 237) and formed between a portion of the gate electrode and the element main surface (3), wherein the field insulating film is thicker than the gate insulating film (216, 237).

[Note 1-9]

The semiconductor device (1) according to note 1-8, wherein the field insulating film (212, 233) integrally includes:

a buried portion (245), buried in the semiconductor chip (2) with respect to the element main surface (3); and a protruding portion (246), protruded toward an opposite side of the buried portion (245) with respect to the element main surface (3), wherein a thickness (T2) from the element main surface (3) to an upper end of the protruding portion (246) is less than or equal to a thickness (T3) from the element main surface (3) to a lower end of the buried portion (245).

[Note 1-10]

The semiconductor device (1) according to note 1-8 or note 1-9, wherein the field insulating film (212, 233) divides a second active region (250) for forming an element structure of the third element (201*a*), and a width (W4) of the third element (201*a*), including a width (W3) of the second active region (250) and a width (W4) of the field insulating film, is less than 2 μm.

[Note 1-11]

The semiconductor device (1) according to any one of note 1-1 to note 1-5, wherein the DTI structure (70) includes a trench gate structure (70) including an upper electrode (73) and a lower electrode (74) buried in a gate trench (71) by a manner of vertical insulation and separation by an insulator (72, 75), the STI structure (106, 136) includes an element isolation structure (106, 136) defining a first active region (105, 135) for forming an element structure of the second element (101*a*), and the LOCOS structure (212, 233) includes a field insulating film (212, 233) formed between a portion of the gate electrode (217, 138) on the element main surface (3) with a gate insulating film (216, 237) between the gate electrode (217, 238) and the element main surface (3), wherein the field insulating film (212, 233) is thicker than the gate insulating film (216, 237).

[Note 1-12]

The semiconductor device (1) according to any one of note 1-1 to note 1-11, wherein the first element (20) includes a output transistor (20) which is gate split type and configured to receive a plurality of gate signals, the second element (101*a*) includes a first p-type channel MIS transistor (103) and a first n-type channel MIS transistor (102), and includes a first CMOS transistor (101*a*) having a first rated voltage, and the third element (201*a*) includes a second p-type channel MIS transistor (203) and a second n-type channel MIS transistor (202), and includes a second CMOS transistor (201*a*) having a second rated voltage higher than the first rated voltage.

[Note 1-13]

The semiconductor device (1) according to note 1-12, wherein the first CMIS transistor (101*a*) forms a logic circuit (32) formed in a control region (7) for controlling the output transistor (20).

[Note 1-14]

The semiconductor device (1) according to note 1-12, wherein the second CMIS transistor (201*a*) forms an amplifier circuit (34) formed in a control region (7) for controlling the output transistor (20).

[Note 1-15]

The semiconductor device (1) according to note 1-12, wherein the first CMIS transistor (101*a*) forms a logic circuit (32) formed in a control region (7) for controlling the output transistor (20); and the second CMIS transistor (201*a*) forms an amplifier circuit (34) formed in a control region (7) for controlling the output transistor (20).

The invention claimed is:

1. A semiconductor device, comprising:

a semiconductor chip, having an element main surface;

a first element, disposed on the element main surface and including a deep trench isolation (DTI) structure as a part of an element structure;

a second element, disposed on the element main surface and separated from the first element, wherein the second element includes a shallow trench isolation (STI) structure; and a third element, disposed on the element main surface and separated from the first element and the second element, wherein the third element includes a local oxidation of silicon (LOCOS) structure.

2. The semiconductor device of claim 1, wherein the DTI structure includes a trench gate structure.

3. The semiconductor device of claim 2, wherein the trench gate structure includes a multi-electrodes structure with an upper electrode and a lower electrode buried in a gate trench by a manner of vertical insulation and separation by an insulator.

4. The semiconductor device of claim 3, wherein the first element includes a output transistor which is gate split type and configured to receive a plurality of gate signals, the second element includes a first p-type channel MIS transistor and a first n-type channel MIS transistor, and includes a first CMOS transistor having a first rated voltage, and the third element includes a second p-type channel MIS transistor and a second n-type channel MIS transistor, and includes a second CMOS transistor having a second rated voltage higher than the first rated voltage.

5. The semiconductor device of claim 2, wherein a plurality of the trench gate structures are formed at intervals on the element main surface of the semiconductor chip, and a pitch of the plurality of trench gate structures is between 1.0 μm and 2.0 μm.

6. The semiconductor device of claim 2, wherein a width of each of the trench gate structures is between 0.4 μm and 2 μm.

7. The semiconductor device of claim 2, wherein the first element includes a output transistor which is gate split type and configured to receive a plurality of gate signals, the second element includes a first p-type channel MIS transistor and a first n-type channel MIS transistor, and includes a first CMOS transistor having a first rated voltage, and the third element includes a second p-type channel MIS transistor and a second n-type channel MIS transistor, and includes a second CMOS transistor having a second rated voltage higher than the first rated voltage.

8. The semiconductor device of claim 1, wherein the STI structure includes an element isolation structure defining a first active region for forming an element structure of the second element, and a width of the second element, including a width of the first active region and a width of the element isolation structure, is less than 1 μm.

9. The semiconductor device of claim 8, wherein in a cross-sectional view along a first direction, the first active region is sandwiched between a pair of element isolation structures from both sides in the first direction, and the width of the second element is a sum of a width of opening ends of trenches of the pair of element isolation structures and a width of the first active region on the element main surface.

10. The semiconductor device of claim 8, wherein the first element includes a output transistor which is gate split type and configured to receive a plurality of gate signals, the second element includes a first p-type channel MIS transistor and a first n-type channel MIS transistor, and includes a first CMOS transistor having a first rated voltage, and the third element includes a second p-type channel MIS transistor and a second n-type channel MIS transistor, and includes a second CMOS transistor having a second rated voltage higher than the first rated voltage.

11. The semiconductor device of claim 1, wherein the third element includes:

a gate electrode, formed over the element main surface across a gate insulating film; and a field insulating film, as the LOCOS structure and formed between a portion of the gate electrode and the element main surface, wherein the field insulating film is thicker than the gate insulating film.

12. The semiconductor device of claim 11, wherein the field insulating film integrally includes:

a buried portion, buried in the semiconductor chip with respect to the element main surface; and a protruding portion, protruded toward an opposite side of the buried portion with respect to the element main surface, and a thickness from the element main surface to an upper end of the protruding portion is less than or equal to a thickness from the element main surface to a lower end of the buried portion.

13. The semiconductor device of claim 11, wherein the field insulating film defining a second active region for forming an element structure of the third element, and a width of the third element, including a width of the second active region and a width of the field insulating film, is less than 2 μm.

14. The semiconductor device of claim 11, wherein the first element includes a output transistor which is gate split type and configured to receive a plurality of gate signals, the second element includes a first p-type channel MIS transistor and a first n-type channel MIS transistor, and includes a first CMOS transistor having a first rated voltage, and the third element includes a second p-type channel MIS transistor and a second n-type channel MIS transistor, and includes a second CMOS transistor having a second rated voltage higher than the first rated voltage.

15. The semiconductor device of claim 1, wherein the DTI structure includes a trench gate structure including an upper electrode and a lower electrode buried in a gate trench by a manner of vertical insulation and separation by an insulator, the STI structure includes an element isolation structure defining a first active region for forming an element structure of the second element, and the LOCOS structure includes a field insulating film formed between a portion of the gate electrode on the element main surface with a gate insulating film between the gate electrode and the element main surface, wherein the field insulating film is thicker than the gate insulating film.

16. The semiconductor device of claim 15, wherein the first element includes a output transistor which is gate split type and configured to receive a plurality of gate signals, the second element includes a first p-type channel MIS transistor and a first n-type channel MIS transistor, and includes a first CMOS transistor having a first rated voltage, and the third element includes a second p-type channel MIS transistor and a second n-type channel MIS transistor, and includes a second CMOS transistor having a second rated voltage higher than the first rated voltage.

17. The semiconductor device of claim 1, wherein the first element includes a output transistor which is gate split type and configured to receive a plurality of gate signals, the second element includes a first p-type channel MIS transistor and a first n-type channel MIS transistor, and includes a first CMOS transistor having a first rated voltage, and the third element includes a second p-type channel MIS transistor and a second n-type channel MIS transistor, and includes a second CMOS transistor having a second rated voltage higher than the first rated voltage.

18. The semiconductor device of claim 17, wherein the first CMOS transistor forms a logic circuit formed in a control region for controlling the output transistor.

19. The semiconductor device of claim 17, wherein the second CMOS transistor forms an amplifier circuit formed in a control region for controlling the output transistor.

20. The semiconductor device of claim 17, wherein the first CMOS transistor forms a logic circuit formed in a control region for controlling the output transistor, and the second CMOS transistor forms an amplifier circuit formed in a control region for controlling the output transistor.

* * * * *